(12) United States Patent
Nagasaka

(10) Patent No.: US 7,803,516 B2
(45) Date of Patent: Sep. 28, 2010

(54) EXPOSURE METHOD, DEVICE MANUFACTURING METHOD USING THE SAME, EXPOSURE APPARATUS, AND SUBSTRATE PROCESSING METHOD AND APPARATUS

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 846 days.

(21) Appl. No.: 11/601,777

(22) Filed: Nov. 20, 2006

(65) Prior Publication Data

US 2007/0172767 A1    Jul. 26, 2007

Related U.S. Application Data

(60) Provisional application No. 60/742,522, filed on Dec. 6, 2005.

(30) Foreign Application Priority Data

Nov. 21, 2005    (JP) .............................. 2005-335509

(51) Int. Cl.
G03F 7/20    (2006.01)
(52) U.S. Cl. ...................... 430/311; 430/394
(58) Field of Classification Search ................. 430/311, 430/394
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,610,683 A | 3/1997 | Takahashi | |
| 5,715,039 A | 2/1998 | Fukuda et al. | |
| 5,825,043 A | 10/1998 | Suwa | |
| 5,969,441 A | 10/1999 | Loopstra | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,897,963 B1 | 5/2005 | Taniguchi et al. | |
| 2004/0165159 A1 | 8/2004 | Lof et al. | |
| 2005/0237504 A1 | 10/2005 | Nagasaka et al. | |
| 2006/0098177 A1 | 5/2006 | Nagasaka | |
| 2006/1017800 | 8/2006 | Endo et al. | |
| 2006/0231206 A1 | 10/2006 | Nagasaka et al. | |
| 2008/0038675 A1* | 2/2008 | Nagasaka ................... 430/322 | |
| 2009/0136876 A1* | 5/2009 | Chen et al. .................. 430/322 | |

FOREIGN PATENT DOCUMENTS

| | | |
|---|---|---|
| DE | 221563 A1 | 4/1985 |
| DE | 224448 A1 | 7/1985 |
| EP | 1 420 298 | 5/2004 |
| JP | A 58-202448 | 11/1983 |
| JP | A 59-19912 | 2/1984 |
| JP | A 62-065326 | 3/1987 |
| JP | A 63-157419 | 6/1988 |
| JP | A 4-305915 | 10/1992 |
| JP | A 4-305917 | 10/1992 |
| JP | A 5-062877 | 3/1993 |
| JP | A 6-124873 | 5/1994 |
| JP | A 7-220990 | 8/1995 |
| JP | A 8-316125 | 11/1996 |
| JP | A 10-048838 | 2/1998 |
| JP | A 10-163099 | 6/1998 |
| JP | A 10-214783 | 11/1998 |
| JP | A 10-303114 | 11/1998 |
| JP | A 10-340846 | 12/1998 |
| JP | A 11-135400 | 5/1999 |
| JP | A 11-176727 | 7/1999 |
| JP | A 2000-058436 | 2/2000 |
| JP | A 2000-505958 | 5/2000 |
| JP | A 2000-164504 | 6/2000 |
| JP | A 2001-510577 | 7/2001 |
| JP | A 2004-519850 | 7/2004 |
| JP | A 2005-012195 | 1/2005 |
| JP | A 2006-215299 | 8/2006 |
| WO | WO 99/23692 | 5/1999 |
| WO | WO 99/28790 | 6/1999 |
| WO | WO 99/49504 | 9/1999 |
| WO | WO 01/35168 A1 | 5/2001 |
| WO | WO 02/069049 A2 | 9/2002 |
| WO | WO 2004/019128 A2 | 3/2004 |
| WO | WO 2004/055803 A1 | 7/2004 |
| WO | WO 2004/057590 A1 | 7/2004 |
| WO | WO 2005/029559 A1 | 3/2005 |
| WO | WO 2005/059617 A2 | 6/2005 |
| WO | WO 2005/059618 A2 | 6/2005 |
| WO | WO 2005/081295 | 9/2005 |

\* cited by examiner

Primary Examiner—Kathleen Duda
(74) Attorney, Agent, or Firm—Oliff & Berridge, PLC

(57) ABSTRACT

An exposure method for exposing a predetermined area on a substrate includes an operation for executing first exposure for the predetermined area by forming a liquid immersion area of a first liquid on the substrate, and an operation for executing second exposure for the predetermined area by forming a liquid immersion area of a second liquid different from the first liquid, on the substrate on which the first exposure has been executed, wherein the surface state of the substrate in the second exposure is allowed to differ from the surface state of the substrate in the first exposure. Even when the substrate is subjected to the first exposure and the second exposure by using the liquid immersion method, then the liquid immersion area of the liquid can be satisfactorily formed on the substrate in each of the exposure processes, and the substrate can be exposed satisfactorily.

47 Claims, 13 Drawing Sheets

Fig. 3
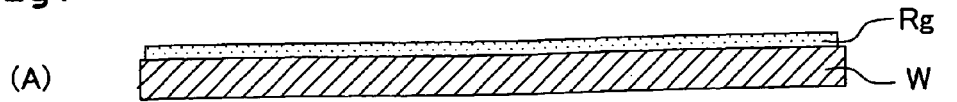
(A)
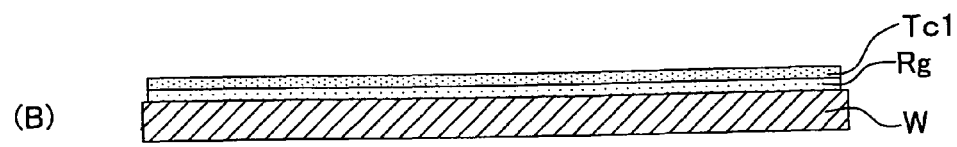
(B)
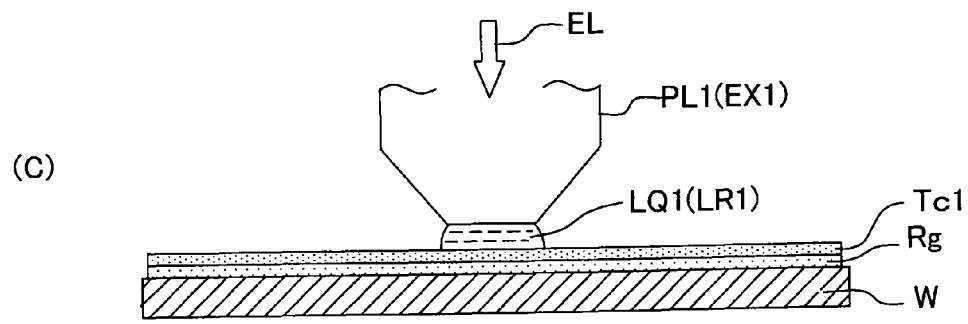
(C)
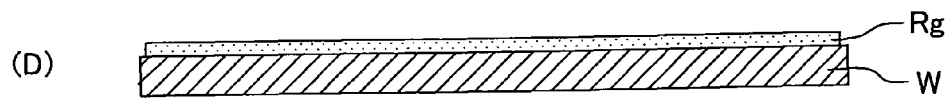
(D)
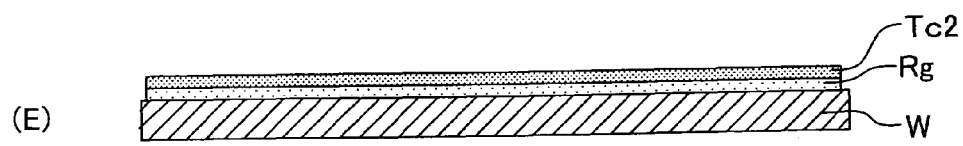
(E)
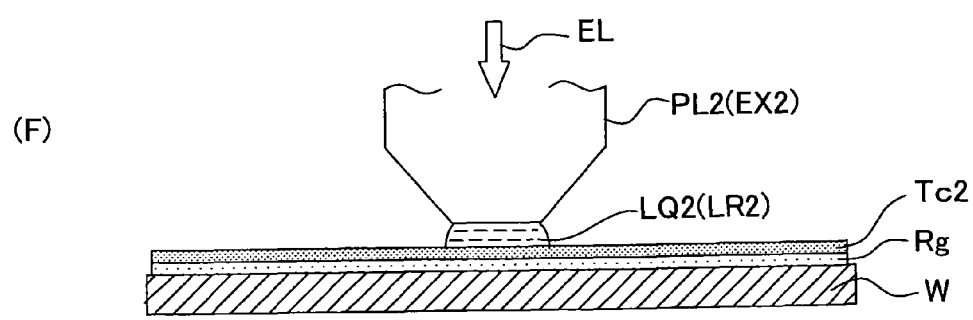
(F)

Fig. 10
(A) 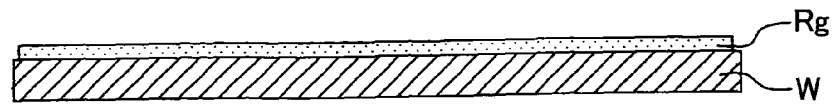
(B) 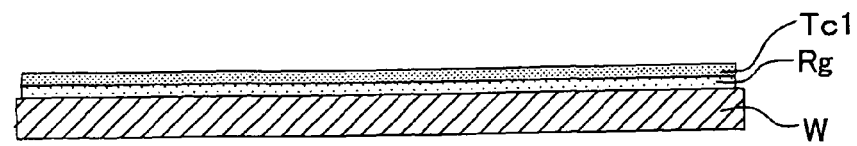
(C) 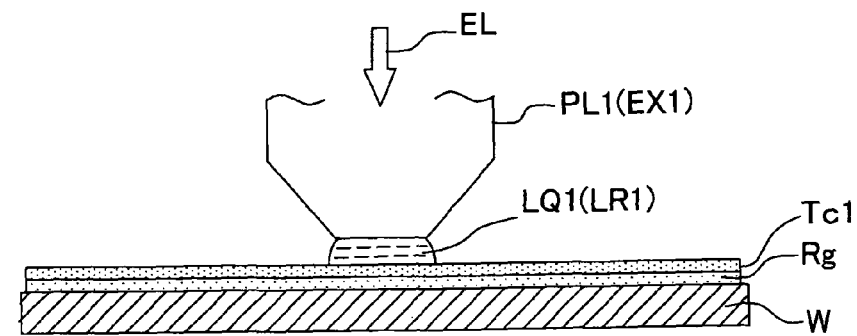
(D) 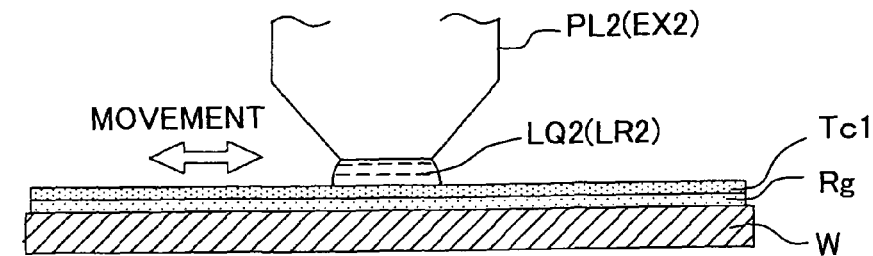
(E) 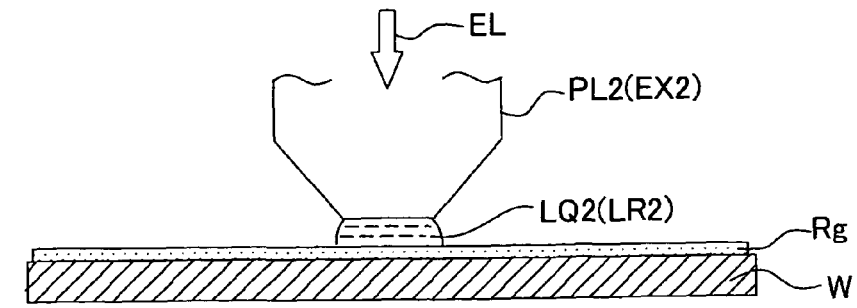

EXPOSURE METHOD, DEVICE MANUFACTURING METHOD USING THE SAME, EXPOSURE APPARATUS, AND SUBSTRATE PROCESSING METHOD AND APPARATUS

CROSS-REFERENCES TO RELATED APPLICATIONS

This application claims the benefit of priority of Japanese Patent Application No. 2005-335509 filed on Nov. 21, 2005 and U.S. Provisional Application No. 60/742,522 filed on Dec. 6, 2005, the entire disclosures of which are incorporated herein by reference.

BACKGROUND OF THE INVENTION

1. Field of the Invention

The present invention relates to an exposure method for exposing a substrate, a device manufacturing method using the same, an exposure apparatus, and a method and an apparatus for processing a substrate.

2. Description of the Related Art

In relation to the technique to be used in the photolithography step, a technique is known, in which a substrate is subjected to the multiple exposure by using the liquid immersion method as disclosed, for example, in International Publication No. 2005/081295. This patent document discloses the execution of the multiple exposure by substantially changing the exposure wavelength by utilizing the difference in the refractive index between the optical path media such that a predetermined area of the substrate is subjected to the exposure not through any liquid, and then the exposure is performed through a liquid.

This patent document discloses the fact that different liquids may be used in the respective exposure processes when the substrate is subjected to the multiple exposure by using the liquid immersion method. When the different liquids are used in the respective exposure processes in the multiple exposure, there is such a possibility that the liquid may remain on the surface of the substrate and/or the exposure failure may arise, depending on the surface state of the substrate.

SUMMARY OF THE INVENTION

The present invention has been made taking the foregoing circumstances into consideration, an object of which is to provide an exposure method, a device manufacturing method using the same, an exposure apparatus, and a method and an apparatus for processing a substrate, in which the substrate can be exposed satisfactorily to form a desired pattern even when the substrate is subjected to the exposure (for example, the multiple exposure) by using the liquid immersion method.

In order to achieve the object as described above, the present invention adopts the following constructions.

According to a first aspect of the present invention, there is provided an exposure method for exposing a predetermined area on a substrate; the exposure method comprising executing first exposure for the predetermined area by forming a liquid immersion area of a first liquid on the substrate; executing second exposure for the predetermined area by forming a liquid immersion area of a second liquid different from the first liquid, on the substrate on which the first exposure has been executed; and making a surface state of the substrate in the second exposure different from a surface state of the substrate in the first exposure.

According to the first aspect of the present invention, even when the first exposure and the second exposure are performed for the substrate by using the liquid immersion method, the substrate can be exposed satisfactorily in each of the exposure processes. The substrate may be subjected to multiple exposure which includes the first exposure and the second exposure.

According to a second aspect of the present invention, there is provided an exposure method for exposing a predetermined area of a substrate; the exposure method comprising selecting a first liquid which is to be supplied onto the substrate in first exposure and a first film which is to be formed on the substrate and which makes contact with the first liquid in the first exposure; selecting a second liquid which is to be supplied onto the substrate in second exposure and which is different from the first liquid and a second film which is to be formed on the substrate, which is different from the first film, and which makes contact with the second liquid in the second exposure; forming a liquid immersion area of the first liquid on the substrate to execute the first exposure for the predetermined area; and forming a liquid immersion area of the second liquid on the substrate, for which the first exposure has been executed, to execute the second exposure for the predetermined area.

According to the exposure method concerning the second aspect of the present invention, the selection is optimally made for the liquids to be used for the first exposure and the second exposure and the films which make contact with the liquids. Therefore, the satisfactory liquid immersion exposure is realized. The substrate may be subjected to multiple exposure which includes the first exposure and the second exposure.

According to a third aspect of the present invention, there is provided a method for producing a device; comprising exposing a substrate by the exposure method as defined in the first or second aspect; developing the exposed substrate; and processing the developed substrate.

According to the third aspect of the present invention, it is possible to produce the device by using the exposure method in which the substrate can be exposed satisfactorily.

According to a fourth aspect of the present invention, there is provided an exposure apparatus which exposes a predetermined area on a substrate; the exposure apparatus comprising a first station in which a first liquid corresponding to a first film is supplied to the substrate, on which the first film is formed, to execute first exposure for the predetermined area; and a second station in which a second liquid corresponding to a second film is supplied to the substrate for which the first substrate has been executed and which is provided with the second film so as to execute second exposure for the predetermined area, the second film being different from the first film, and the second liquid being different from the first liquid.

In the exposure apparatus according to the fourth aspect of the present invention, when the first exposure and the second exposure are performed for the substrate by using the liquid immersion method, the liquids, which correspond to the different films of the substrate, are provided for the first and second stations in the respective exposure processes. Therefore, it is possible to expose the substrate satisfactorily. The substrate may be subjected to multiple exposure which includes the first exposure and the second exposure.

According to a fifth aspect of the present invention, there is provided a substrate processing apparatus which forms a film on a base material of a substrate on which first exposure and second exposure are to be performed; the substrate processing apparatus comprising a film-forming unit which forms, on the base material, a first film (Tc1), which is to make contact with a first liquid, before performing the first exposure through the first liquid and which forms, on the base material, a second film, which is to make contact with a second liquid, before performing the second exposure through the second liquid, the second liquid being different from the first liquid and the second film being different from the first film.

When the substrate processing apparatus according to the fifth aspect of the present invention is used, the different films, which make contact with the liquids to be used for the first exposure and the second exposure respectively, are formed on the base material. Therefore, the satisfactory liquid immersion exposure is realized. The substrate may be subjected to multiple exposure which includes the first exposure and the second exposure.

According to a sixth aspect of the present invention, there is provided a substrate processing method for forming a film on a base material of a substrate on which first exposure and second exposure are to be performed; the substrate processing method comprising forming on the base material a first film, which is to make contact with a first liquid, before performing the first exposure through the first liquid; and forming on the base material a second film, which is to make contact with a second liquid, before performing the second exposure through the second liquid, the second liquid being different from the first liquid and the second film being different from the first film.

When the substrate processing method according to the sixth aspect of the present invention is used, the different films, which make contact with the liquids to be used for the first exposure and the second exposure respectively, are formed on the base material. Therefore, the satisfactory liquid immersion exposure is realized. The substrate may be subjected to multiple exposure which includes the first exposure and the' second exposure.

According to the present invention, even when the substrate is subjected to the exposure (for example, the multiple exposure) by using the liquid immersion method, the substrate can be exposed satisfactorily. Therefore, it is possible to produce the device having desired performance.

BRIEF DESCRIPTION OF THE DRAWINGS

FIGS. 3(A) to 3(F) schematically illustrate the processing procedure according to the first embodiment.

FIGS. 10(A) to 10(E) schematically illustrate the processing procedure according to the fourth embodiment.

DESCRIPTION OF THE PREFERRED EMBODIMENTS

Embodiments of the present invention will be explained below with reference to the drawings. However, the present invention is not limited thereto. In the following description, the XYZ rectangular coordinates system is defined. The positional relationship concerning respective members will be explained with reference to the XYZ rectangular coordinates system. The X axis direction is a predetermined direction in a horizontal plane. The Y axis direction is a direction which is perpendicular to the X axis direction in the horizontal plane. The Z axis direction is a direction which is perpendicular to the X axis direction and the Y axis direction respectively (i.e., the vertical direction). The directions of rotation (inclination) about the X axis, the Y axis, and the Z axis are designated as the $\theta X$, $\theta Y$, and $\theta Z$ directions respectively.

First Embodiment

Figure 1:
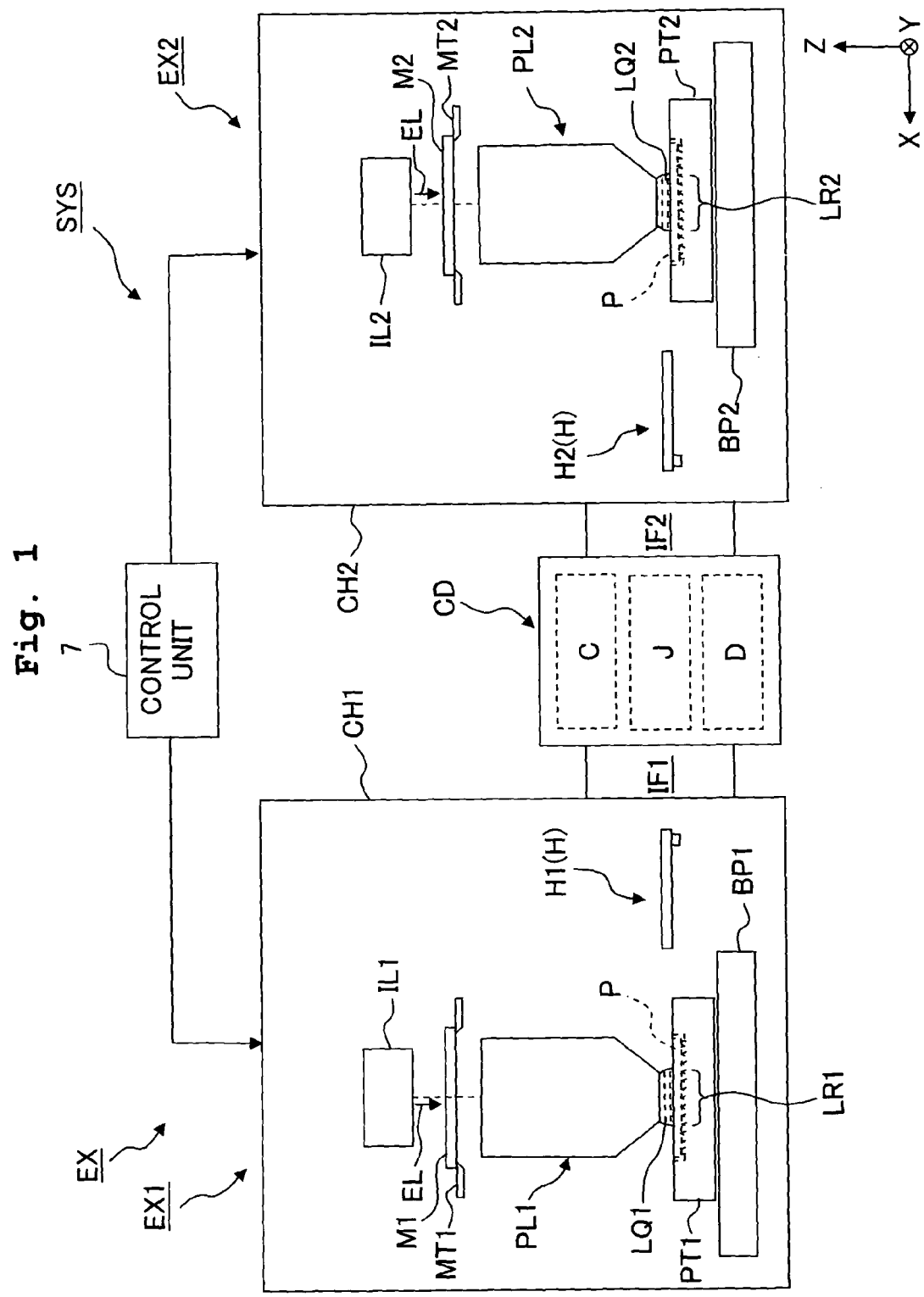
FIG. 1 shows a schematic arrangement illustrating a device-producing system provided with an exposure apparatus according to a first embodiment.

A first embodiment will be explained. FIG. 1 shows an embodiment of a device-producing system SYS provided with an exposure apparatus EX according to the first embodiment. With reference to FIG. 1, the device-producing system SYS includes the exposure apparatus EX for exposing a substrate P, a coater/developer apparatus CD, and a transport system H for transporting the substrate P.

The exposure apparatus EX of this embodiment performs the multiple exposure for the substrate P. The exposure apparatus EX includes a first station EX1 which exposes the substrate P, a second station EX2 which exposes the substrate P having been exposed in the first station EX1, and a control unit 7 which controls the operation of the entire exposure apparatus EX. In this embodiment, the control unit 7 also controls the operation of the coater/developer apparatus CD. However, it is also allowable to provide a control unit for the coater/developer apparatus CD separately from the control unit 7. In this case, it is also allowable to provide a superordinate control unit (for example, a host computer) for integrally controlling the entire device-producing system SYS (or at least the exposure apparatus EX and the coater/developer apparatus CD).

The first station EX1 includes a first mask stage MT1 which is movable while holding a first mask M1, a first illumination system IL1 which illuminates, with an exposure light beam EL, the first mask M1 held by the first mask stage MT1, and a first projection optical system PL1 which projects, onto the substrate P, an image of a pattern of the first mask M1 illuminated with the exposure light beam EL. The second station EX2 includes a second mask stage MT2 which is movable while holding a second mask M2, a second illumination system IL2 which illuminates, with an exposure light beam EL, the second mask M2 held by the second mask stage MT2, and a second projection optical system PL2 which projects, onto the substrate P, an image of a pattern of the second mask M2 illuminated with the exposure light beam EL.

The substrate referred to herein includes those obtained by coating a base material such as a semiconductor wafer with a photosensitive material (photoresist) as well as various films such as a protective film called "top coat film" for covering the photosensitive material. The mask includes a reticle formed with a device pattern to be subjected to the reduction projection onto the substrate. In this embodiment, a transmissive type mask is used as the mask. However, it is also allowable to use a reflective type mask.

The first and second stations EX1, EX2 are respectively provided with first and second chamber apparatuses CH1, CH2 each of which accommodates, for example, all or a part of the illumination system (for example, an illumination optical system other than an ArF excimer laser (light source)), the mask stage, the projection optical system, the substrate stage, and the like. The first station EX1 and the second station EX2 are provided separately from each other. In this embodiment, the coater/developer apparatus CD is arranged between the first station EX1 and the second station EX2. The first station EX1 is connected to the coater/developer apparatus CD via a first interface IF1. The second station EX2 is connected to the coater/developer apparatus CD via a second interface IF2.

The coater/developer apparatus CD includes a coating unit C which forms a predetermined film on the base material by coating the base material of the substrate P with a predetermined material before the substrate P is subjected to the exposure, and a developer unit D which develops the substrate P after the substrate P has been subjected to the exposure, by using a developing solution. The coater/developer apparatus CD also includes a removing unit J which removes the predetermined film formed on the base material of the substrate P. The coater/developer apparatus CD also includes a bake unit (not shown) which heat-treats the substrate P.

The transport system H includes a first transport system H1 which transports the substrate P between the first interface IF1 and the first station EX1, and a second transport system H2 which transports the substrate P between the second interface IF2 and the second station EX2. The first transport system H1 has the following function. That is, the substrate P before being subjected to the exposure by the first station EX1 is loaded onto the first substrate stage PT1 of the first station EX1.

Further, the substrate P after being subjected to the exposure by the first station EX1 is unloaded from the first substrate stage PT1. The second transport system H2 has the following function. That is, the substrate P before being subjected to the exposure by the second station EX2 after being subjected to the exposure by the first station EX1 is loaded onto the second substrate stage PT2 of the second station EX2. Further, the substrate P after being subjected to the exposure is unloaded from the second substrate stage PT2. Although not shown, the transport system H also includes a third transport system which transports the substrate P between the first interface IF1 and the coater/developer apparatus CD, and a fourth transport system which transports the substrate P between the second interface IF2 and the coater/developer apparatus CD. That is, the transport system H is capable of transporting the substrate P among the first station EX1, the coater/developer apparatus CD, and the second station EX2.

In this embodiment, the first station EX1 and the second station EX2 execute the liquid immersion exposure for radiating the exposure light beam EL onto the substrate P through the liquid respectively. In the first station EX1, the liquid immersion area LR1 of the first liquid LQ1 is formed on the substrate P, and the first exposure is executed for the predetermined area on the substrate P. In the second station EX2, the substrate P, for which the first exposure has been executed in the first station EX1, is received without performing the development. Further, the second liquid LQ2, which is different from the first liquid LQ1, is used to form the liquid immersion area LR2 thereof on the substrate P, and the second exposure is executed for the predetermined area on the substrate P.

The first projection optical system PL1 has a plurality of optical elements. The space between the substrate P and a last (end) optical element closest to the image plane of the first projection optical system PL1, among the plurality of optical elements of the first projection optical system PL1, is filled with the first liquid LQ1. The first liquid LQ1 is used to form the liquid immersion area LR1 of the first liquid LQ1 on the substrate P so as to fill the optical path for the exposure light beam EL between the surface of the substrate P and the last optical element of the first projection optical system PL1. In this embodiment, the liquid LQ, with which the optical path for the exposure light beam EL is filled between the substrate P and the last optical element of the first projection optical system PL1, locally forms the liquid immersion area LR1 in a part of the area on the substrate P including the projection area of the first projection optical system PL1, the liquid immersion area LR1 being larger than the projection area and smaller than the substrate P.

Similarly, the second projection optical system PL2 has a plurality of optical elements. The second liquid LQ2 is used to locally form the liquid immersion area LR2 of the second liquid LQ2 on the substrate P so as to fill the optical path for the exposure light beam EL between the substrate P and a last (end) optical element closest to the image plane of the second projection optical system PL2, among the plurality of optical elements of the second projection optical system PL2.

The respective first and second illumination systems IL1, IL2 illuminate, with the exposure light beam EL having an uniform illuminance distribution, predetermined illumination areas on the first and second masks M1, M2 held by the first and second mask stages MT1, MT2 respectively. Those usable as the exposure light beam EL to be radiated from each of the first and second illumination systems IL1, IL2 include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

Each of the first and second mask stages MT1, MT2 is movable in at least the X axis direction, the Y axis direction, and the θZ direction in a state in which the mask M is held, in accordance with the driving operation of a mask stage-driving unit including an actuator such as a linear motor. The position information (including the rotation information) of each of the first and second mask stages MT1, MT2 (as well as each of the masks M1, M2) is measured by an unillustrated laser interferometer system. The laser interferometer system measures the position information about each of the first and second mask stages MT1, MT2 by using a movement mirror (a reflecting mirror or a reflecting surface formed on a side surface thereof) fixedly secured on each of the first and second mask stages MT1, MT2. The control unit 7 drives the mask stage-driving unit on the basis of the result of the measurement performed by the laser interferometer system to perform the positional control of the masks M1, M2 held by the first and second mask stages MT1, MT2 respectively.

Each of the first and second projection optical systems PL1, PL2 projects the image of the pattern of the mask M onto the substrate P at a predetermined projection magnification. In this embodiment, each of the first and second projection optical systems PL1, PL2 is the reduction system having the projection magnification which is, for example, ¼, ⅕, or ⅛.

Each of the first and second projection optical systems PL1, PL2 may be based on any one of the 1× magnification system and the magnifying system. Each of the first and second projection optical systems PL1, PL2 may be based on any one of the dioptric system including no catoptric optical element, the catoptric system including no dioptric optical element, and the catadioptric system including dioptric and catoptric optical elements. Each of the first and second projection optical systems PL1, PL2 may form any one of an inverted image and an erecting image. Of course, it is also allowable that the optical characteristic (optical performance) differs between the first projection optical system PL1 and the second projection optical system PL2.

Each of the first and second substrate stages PT1, PT2 has a substrate holder (not shown) for holding or retaining the substrate P. Each of the first and second substrate stages PT1, PT2 is movable in the directions of six degrees of freedom of the X axis, Y axis, Z axis, θX, θY, and θZ directions in a state in which the substrate P is held by the substrate holder, on the base member BP1, BP2 in accordance with the driving operation of a substrate stage-driving unit including an actuator such as a linear motor. The position information (including the rotation information) of each of the first and second substrate stages PT1, PT2 (as well as the substrate P) is measured by an unillustrated laser interferometer system. The laser interferometer system measures the position information about each of the first and second substrate stages PT1, PT2 in relation to the X axis direction, the Y axis direction, and the θZ direction by using a movement mirror (or a reflecting surface formed on a side surface thereof) provided on each of the first and second substrate stages PT1, PT2. The surface position information (position information in relation to the Z axis direction, the θX direction, and the θY direction) of the surface of the substrate P held by each of the first and second substrate stages PT1, PT2 is detected by an unillustrated focus/leveling-detecting system. The control unit 7 drives the substrate stage-driving unit on the basis of the result of the measurement performed by the laser interferometer system and the result of the detection performed by the focus/leveling-detecting system to control the position of the substrate P held by each of the first and second substrate stages PT1, PT2. The substrate holder for holding the substrate P is arranged in a recess provided on each of the first and second substrate stages PT1, PT2. The upper surface of each of the first and second substrate stages PT1, PT2 except for the recess is the flat surface so that the upper surface has an approximately same height as that of (is flush with) the surface of the substrate P held by the substrate holder. It is also allowable to provide any difference in height between the surface of the substrate P held by the substrate holder and the upper surface of each of the first and second substrate stages PT1, PT2. It is also allowable that the laser interferometer system is capable of measuring the position information in relation to the Z axis direction, the θX direction, and the θY direction of the substrate stage PT1, PT2 as well. Details thereof are disclosed, for example, in Published Japanese Translation of PCT International Publication for Patent Application No. 2001-510577 (corresponding to International Publication No. 1999/28790).

Figure 2:
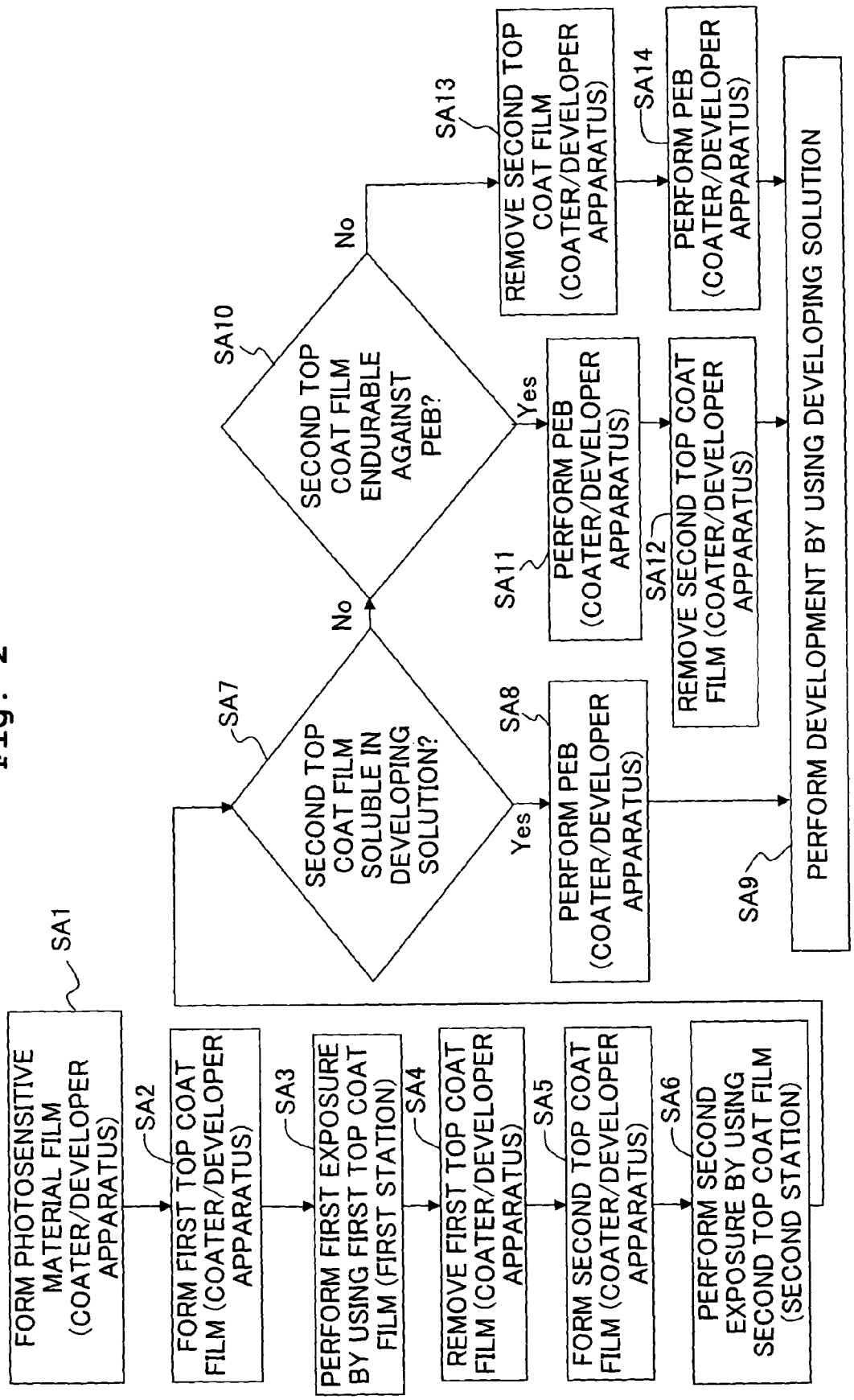
FIG. 2 shows a flow chart illustrating a processing procedure according to the first embodiment.

Next, an explanation will be made with reference to a flow chart shown in FIG. 2 and a schematic illustration shown in FIG. 3 about the operation for processing the substrate P by using the device-producing system SYS including the exposure apparatus EX constructed as described above.

In this embodiment, the exposure apparatus EX performs the multiple exposure for the predetermined area (for example, each of a plurality of shot areas) on the substrate P by using the first and second stations EX1, EX2. In this embodiment, the first exposure is executed for the predetermined area on the substrate P by forming the liquid immersion area LR1 of the first liquid LQ1 on the substrate P in the first station EX1. The substrate P is moved to the second station EX2 without performing the development process step. In the second station EX2, the second liquid LQ2, which is different from the first liquid LQ1, is used to form the liquid immersion area LR2 of the second liquid LQ2, on the substrate P on which the first exposure has been executed, so that the second exposure is performed for the predetermined area on the substrate P. The first exposure and the second exposure are executed while allowing the surface state of the substrate P to differ between the first station ST1 and the second station ST2.

The substrate P includes a base material and a predetermined film formed on the base material. The base material includes, for example, a semiconductor wafer such as a silicon wafer. The film to be formed on the base material is exemplified, for example, by a film of a photosensitive material (photoresist) and a protective film called "top coat film" which covers the film of the photosensitive material. The surface of the substrate P includes the surface of the film formed on the base material of the substrate P. In this embodiment, the film for forming the surface of the substrate P differs between the first exposure performed in the first station EX1 and the second exposure performed in the second station EX2.

The top coat film has the function to protect the photosensitive material and the base material from the liquid. The top coat film has a predetermined contact angle (including a backward contact angle) of, for example, not less than 90° with respect to the liquid. When the top coat film is liquid-repellent with respect to the liquid, it is possible to enhance the recovery performance for recovering the liquid from the substrate P.

The film for forming the surface of the substrate P, i.e., the film (film of the photosensitive material or the top coat film) of the uppermost layer (outermost layer) makes contact with the liquid of the liquid immersion area formed on the substrate P. It is desirable that the type (physical property) of the film which makes contact with the liquid is optimized depending on the liquid to be used in order that the liquid immersion area of the liquid is satisfactorily formed on the substrate P, the outflow of the liquid is suppressed when the substrate P is moved in a state in which the space between the projection optical system and the substrate is filled with the liquid, the remaining of the liquid on the substrate P is suppressed, and/or the photosensitive material and the base material are satisfactorily protected from the liquid. In another viewpoint, the type of the film usable for the way of use as described above is restricted. Therefore, it is necessary to select the liquid which is preferable for the selected film material. Strictly, the exposure light beam is transmitted through the film. Therefore, the refractive index and the transmittance of the film affect the resolution and the exposure intensity. Therefore, it is necessary to examine the film to be formed on the substrate and the liquid to be supplied onto the substrate, and it is necessary to optimize the correlating relationship between them. In the multiple exposure, for example, the illumination condition is changed for the respective exposure processes in some cases. However, in the multiple exposure based on the use of the liquid immersion exposure, the wavelength of the exposure light beam can be substantially changed by changing the type of the liquid (and the film) in at least two times of the exposure processes. When the type (physical property) of the liquid to be used is different between the first exposure and the second exposure, it is desirable to optimize the film for forming the surface of the substrate P depending on the liquid to be used in the first exposure and the second exposure. Accordingly, in this embodiment, the film for forming the surface of the substrate P (film which makes contact with the liquid) is allowed to differ between the first exposure in which the first liquid LQ1 is used and the second exposure in which the second liquid LQ2 is used. In another viewpoint, the combination of the liquid to be used and the film for forming the surface of the substrate P (film which makes contact with the liquid) is allowed to differ (optimized respectively) between the first exposure and the second exposure.

At first, as shown in FIG. 3(A), a film of the photosensitive material (hereinafter referred to as "photosensitive material film") Rg is formed on a base material W of the substrate P by the coating unit C of the coater/developer apparatus CD (Step SA1). The coating unit C forms the photosensitive material film Rg on the base material W by a predetermined coating method including, for example, the spin coat method and the scan coat method.

Subsequently, as shown in FIG. 3(B), a first top coat film Tc1 is formed on the photosensitive material film Rg on the base material W by the coating unit C of the coater/developer apparatus CD (Step SA2). The coating unit C forms the first top coat film Tc1 on the photosensitive material film Rg by a predetermined coating method including, for example, the spin coat method and the scan coat method.

The first top coat film Tc1 is determined depending on the first liquid LQ1 or together with the first liquid LQ1. The first top coat film Tc1 is a film which is suitable for the first liquid LQ1 to be used in the first station EX1.

Subsequently, the substrate P, on which the first top coat film Tc1 has been formed, is transported to the first station EX1 by the control unit 7 by the aid of the transport system H. The first transport system H1 of the transport system H loads the substrate P on the first substrate stage PT1. As shown in FIG. 3(C), the control unit 7 forms the liquid immersion area LR1 of the first liquid LQ1 on the first top coat film Tc1 of the substrate P to execute the first exposure for the predetermined area on the substrate P (Step SA3). The first top coat film Tc1, which is used in the first exposure, is the film adapted to the first liquid LQ1. The first station EX1 executes the first exposure by using the first top coat film Tc1.

After the first exposure is completed for the substrate P in the first station EX1, the substrate P, for which the first exposure has been completed, is transported by the transport system H to the coater/developer apparatus CD. As shown in FIG. 3(D), the first top coat film Tc1 is removed by the removing unit J from the substrate P which has been transported to the coater/developer apparatus CD. That is, the removing unit J removes (exfoliates or strips) the first top coat film Tc1 disposed on the photosensitive material film Rg on the base material W before the second exposure is performed after the completion of the first exposure. The first top coat film Tc1, which has been used in the first exposure, is chemically removed by the removing unit J by using, for example, a removing liquid (solvent or stripper) adapted to the first top coat film Tc1.

After the removal of the first top coat film Tc1, as shown in FIG. 3(E), a second top coat film Tc2 is formed on the photosensitive material film Rg on the base material W by the coating unit C of the coater/developer apparatus CD (Step SA5). The coating unit C forms the second top coat film Tc2 on the photosensitive material film Rg by a predetermined coating method including, for example, the spin coat method and the scan coat method.

The second top coat film Tc2 is determined depending on the second liquid LQ2 or together with the second liquid LQ2. In view of the purpose of the multiple exposure, the second top coat film Tc2 and the second liquid LQ2 are also determined in relation to the first top coat film Tc1 and the first liquid LQ1. The second top coat film Tc2 is a film which is suitable for the second liquid LQ2 to be used in the second station EX2.

Subsequently, the substrate P, on which the second top coat film Tc2 has been formed, is transported to the second station EX2 by the control unit 7 by the aid of the transport system H. The second transport system H2 of the transport system H loads the substrate P on the second substrate stage PT2. As shown in FIG. 3(F), the control unit 7 forms the liquid immersion area LR2 of the second liquid LQ2 on the second top coat film Tc2 of the substrate P to execute the second exposure for the predetermined area on the substrate P (Step SA6). As described above, the second exposure is executed in the second station EX2 for the predetermined area on the substrate P for which the first exposure has been executed in the first station EX1. Accordingly, the predetermined area on the substrate P is subjected to the multiple exposure (double exposure in this embodiment). The second top coat film Tc2, which is used in the second exposure, is the film adapted to the second liquid LQ2. The second station EX2 executes the second exposure by using the second top coat film Tc2 and the second liquid LQ2.

After the completion of the second exposure for the substrate P in the second station EX2, the substrate P, for which the second exposure has been completed, is transported by the transport system H to the coater/developer apparatus CD. The substrate P, for which the second exposure has been completed, is transported to the developer unit D by the transport system H in order that that the substrate P, for which the second exposure has been completed, is developed by using the developing solution in the developer unit D.

Before the substrate P is developed, it is judged whether or not the second top coat film Tc2 is soluble in the developing solution, for example, on the basis of the information previously stored, for example, in the control unit 7 (Step SA7). If it is judged in Step SA7 that the second top coat film Tc2 is soluble in the developing solution, the bake unit (not shown) of the coater/developer apparatus CD executes the heat treatment (post bake) called "PEB (Post Exposure Bake)" for the substrate P for which the second exposure has been completed (Step SA8).

After the completion of PEB, the developer unit D of the coater/developer apparatus CD develops the substrate P by using the developing solution (Step SA9). The second top coat film Tc2 is removed from the surface of the substrate P by the developing solution, because the second top coat film Tc2 is soluble in the developing solution. Further, the photosensitive material film Rg is removed in accordance with the area onto which the exposure light beam EL has been radiated.

If it is judged in Step SA7 that the second top coat film Tc2 is not soluble in the developing solution, it is judged whether or not the second top coat film Tc2 is endurable against PEB (Step SA10). The phrase "top coat film is endurable against PEB" herein includes, for example, a case in which the top coat film is not deteriorated by PEB (heat treatment) and the case in which the top coat film never (scarcely) affects the photosensitive material film Rg and the base material W (device pattern) formed in the layer disposed thereunder as well.

If it is judged in Step SA10 that the second top coat film Tc2 is endurable against PEB, PEB is executed for the substrate P (Step SA11).

After the completion of PEB, the removing unit J of the coater/developer apparatus CD removes (strips) the second top coat film Tc2 by using the removing unit J (Step SA12). The removing unit J chemically removes the second top coat film Tc2 which is disposed on the substrate P and which is not soluble in the developing solution, by using, for example, a removing liquid (solvent or stripper) adapted to the second top coat film Tc2 before performing the development. The developer unit D of the coater/developer apparatus CD develops the substrate P by using the developing solution (Step SA9).

On the other hand, if it is judged in Step SA10 that the second top coat film Tc2 is not endurable against PEB, the second top coat film Tc2 is removed by the removing unit J (Step SA13). After the second top coat film Tc2 is removed, the bake unit of the coater/developer apparatus CD performs PEB for the substrate P (Step SA14). After PEB is performed, the developer unit D of the coater/developer apparatus CD develops the substrate P by using the developing solution (Step SA9).

As explained above, even when the substrate P is subjected to the multiple exposure by using the liquid immersion method, the surface state of the substrate P is allowed to differ depending on the first and second liquids LQ1, LQ2 in the first exposure and the second exposure respectively. Accordingly, the liquid immersion areas LR1, LR2 of the first and second liquids LQ1, LQ2 can be satisfactorily formed on the substrate P, and the substrate P can be exposed satisfactorily. Each of the first top coat film Tc1 and the second top coat film Tc2 is the film which makes contact with the liquid of the liquid immersion area. When the first and second top coat films Tc1, Tc2 are determined depending on the first and second liquids LQ1, LQ2 or together with the first and second liquids LQ1, LQ2, then the liquid immersion area of the liquid can be formed satisfactorily on the substrate P, the outflow of the liquid can be suppressed when the substrate P is moved in a state in which the space between the projection optical system and the substrate is filled with the liquid, the remaining of the liquid on the substrate P can be suppressed by recovering the liquid from the substrate P in a well-suited manner, the deterioration of the top coat film by the liquid can be suppressed, and the photosensitive material film and the base material can be protected satisfactorily by suppressing the infiltration of the liquid into the photosensitive material film and/or the base material.

That is, the substrate P can be exposed satisfactorily by determining the first and second top coat films Tc1, Tc2 while considering, for example, the affinity for the first and second liquids LQ1, LQ2 (including the contact angle), the durability against the first and second liquids LQ1, LQ2, and the block property. It is not necessarily indispensable that all of these factors are considered. The first and second top coat films Tc1, Tc2, the first and second liquids LQ1, LQ2, and the combination thereof may be determined by considering only a part of these factors. That is, the present invention includes, when the predetermined area of the substrate is exposed by the multiple exposure including the first exposure and the second exposure, previously selecting the first liquid which is to be supplied onto the substrate in the first exposure and the first film which is to be formed on the substrate and which makes contact with the first liquid in the first exposure; and previously selecting the second liquid which is to be supplied onto the substrate in the second exposure and which is different from the first liquid and the second film which is to be formed on the substrate, which is different from the first film, and which makes contact with the second liquid in the second exposure. The first exposure and the second exposure are performed by using the first and second liquids and the first and second films selected as described above.

In this embodiment, the substrate P is subjected to the multiple exposure by using the plurality of stations (exposure apparatuses). Therefore, each of the stations (exposure apparatuses) can perform the exposure under the optimum exposure condition, and the substrate P can be subjected to the multiple exposure efficiently.

In the first embodiment described above, after the completion of the first exposure in the first station EX1, the second top coat film Tc2 is formed on the photosensitive material film Rg after removing the first top coat film Tc1 disposed on the photosensitive material film Rg. However, between the first exposure and the second exposure, the second top coat film Tc2 may be formed on the first top coat film Tc1 having been used in the first exposure. For example, when the substrate P is processed by using the device-producing system SYS shown in FIG. 1, then the photosensitive material film Rg is firstly formed on the base material W by the coating unit C, and then the first top coat film Tc1 is formed on the photosensitive material film Rg. The substrate P, on which the first top coat film Tc1 is formed, is transported to the first station EX1, and the liquid immersion area LR1 of the first liquid LQ1 is formed on the first top coat film Tc1 to execute the first exposure for the substrate P. Subsequently, the substrate P, for which the first exposure has been completed, is transported to the coating unit C, and the second top coat film Tc2 is formed on the first top coat film Tc1 which has been used in the first exposure, without removing the first top coat film Tc1. The substrate P, on which the first and second top coat films Tc1, Tc2 are formed, is transported to the second station EX2, and the liquid immersion area LR2 of the second liquid LQ2 is formed on the second top coat film Tc2 to execute the second exposure for the substrate P. In this case, it is possible to omit the step of removing the first top coat film Tc1 between the first exposure and the second exposure. Therefore, it is possible to shorten the processing time required to perform the multiple exposure for the predetermined area on the substrate P. The photosensitive material film Rg can be protected by the first top coat film Tc1 or by both of the first top coat film Tc1 and the second top coat film Tc2 without exposing the photosensitive material film Rg during the first exposure and the second exposure as well.

In the first embodiment described above, the first top coat film Tc1 is used in the first exposure in the first station EX1, and the second top coat film Tc2 is used in the second exposure in the second station EX2. However, it is also allowable that any one of the top coat films Tc1, Tc2 is not used, depending on the characteristic (physical property) of the liquid (LQ1 or LQ2). That is, it is rather desirable in some cases that the photosensitive material film Rg forms the surface of the substrate P considering the affinity for the liquid (LQ1 or LQ2) and/or the durability or resistance against the liquid. For example, the first exposure in the first station EX1 can be executed in a state in which the first liquid LQ1 and the photosensitive material film Rg are allowed to make contact with each other. In this case, it is possible to omit the step of forming the first top coat film Tc1 before the execution of the first exposure and the step of removing the first top coat film Tc1 after the completion of the first exposure. Further, it is possible to shorten the processing time required for the multiple exposure for the substrate P. In another viewpoint, the second exposure in the second station EX2 can be executed in a state in which the second liquid LQ2 and the photosensitive material film Rg are allowed to make contact with each other. In this case, it is possible to omit the step of forming the second top coat film Tc2 between the first exposure and the second exposure and the step of removing the second top coat film Tc2 after the completion of the second exposure (when the second top coat film Tc2 is not soluble in the developing solution).

In the first embodiment described above, it is judged whether or not the second top coat film Tc2 is soluble in the developing solution (Step SA7) and whether or not the second top coat film Tc2 is endurable against PEB (Step SA10). However, for example, the next process (any one of Steps SA8, SA11, and SA13 shown in FIG. 2), which is to be executed continuously to the second exposure (Step SA6), may be previously determined, and the process may be stored, for example, in the control unit of the coater/developer apparatus CD or any superordinate unit thereof. The substrate P may be processed without performing the judgment (SA7, SA10) by the coater/developer apparatus CD.

Second Embodiment

Figure 4:
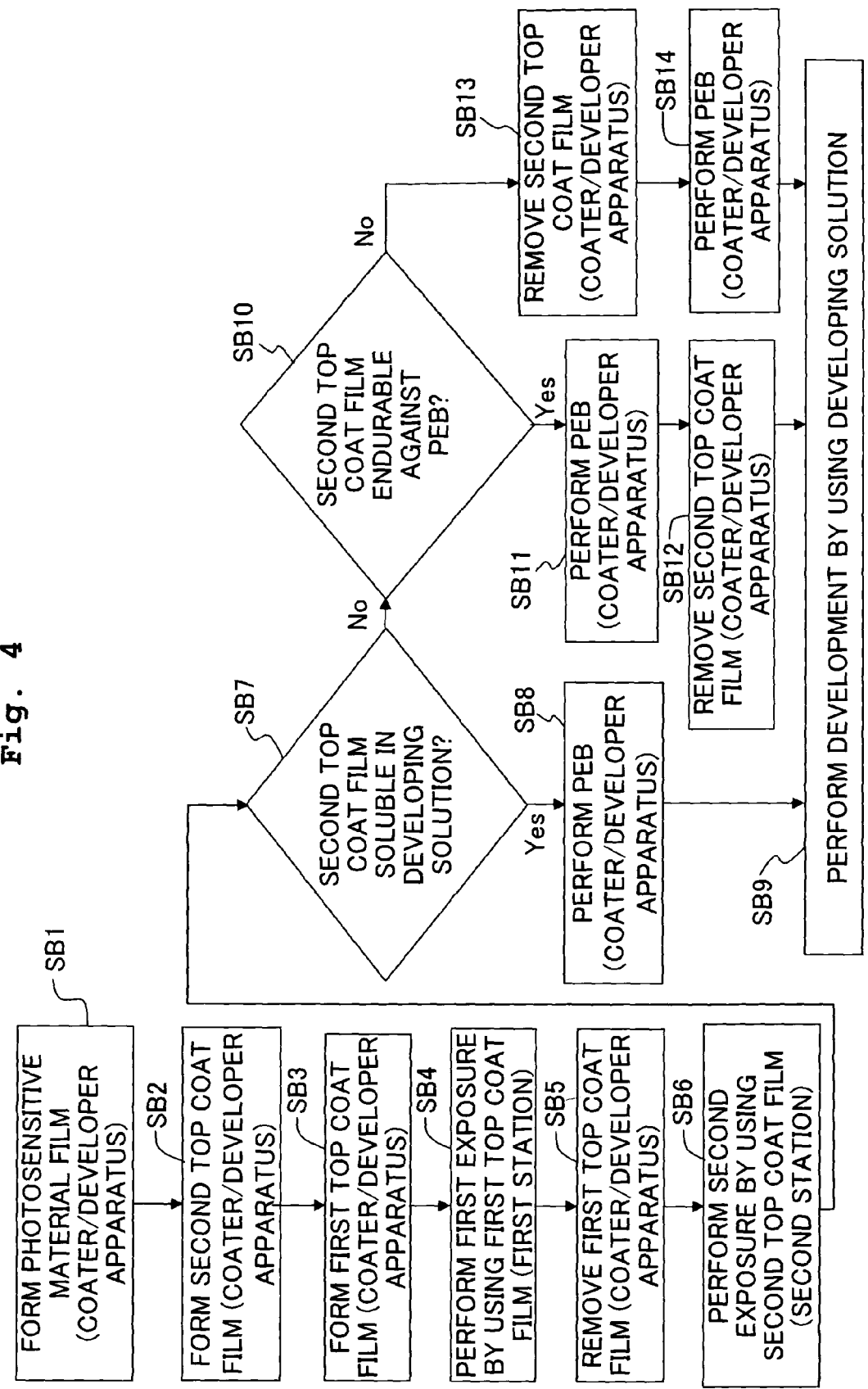
FIG. 4 shows a flow chart illustrating a processing procedure according to a second embodiment.
Figure 5:
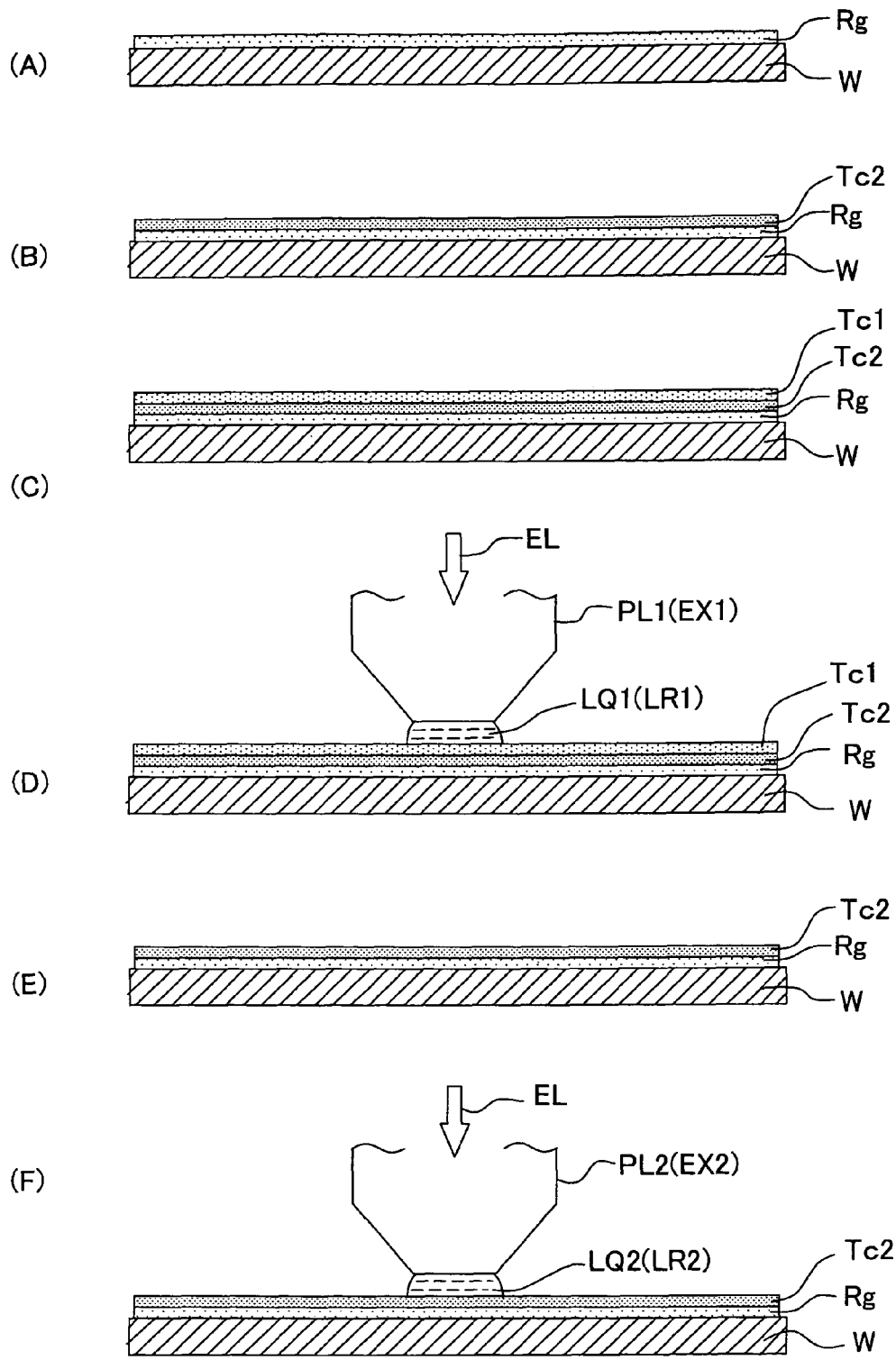
FIGS. 5(A) to 5(F) schematically illustrate the processing procedure according to the second embodiment.

Next, a second embodiment will be explained with reference to a flow chart shown in FIG. 4 and a schematic illustration shown in FIG. 5. The device-producing system SYS explained with reference to FIG. 1 is also used in the second embodiment. In the following description, the constitutive components or parts, which are the same as or equivalent to those of the embodiment described above, are designated by the same reference numerals, any explanation of which will be simplified or omitted.

At first, as shown in FIG. 5(A), a photosensitive material film Rg is formed on a base material W of the substrate P by the coating unit C of the coater/developer apparatus CD (Step SB1).

Subsequently, as shown in FIG. 5(B), a second top coat film Tc2 is formed on the photosensitive material film Rg on the base material W by the coating unit C of the coater/developer apparatus CD (Step SB2).

Subsequently, as shown in FIG. 5(C), the first top coat film Tc1 is formed on the second top coat film Tc2 on the photosensitive material film Rg on the base material W by the coating unit C of the coater/developer apparatus CD (Step SB3).

Subsequently, the substrate P, on which the first and second top coat films Tc1, Tc2 are formed, is transported to the first station EX1 by the control unit 7 by the aid of the transport system H. As shown in FIG. 5(D), the control unit 7 forms a liquid immersion area LR1 of the first liquid LQ1 on the first top coat film Tc1 of the substrate P to execute the first exposure for a predetermined area on the substrate P (Step SB4). The first top coat film Tc1, which is used in the first exposure, is the film adapted to the first liquid LQ1. The first station EX1 executes the first exposure by using the first top coat film Tc1. The first station EX1 executes the first exposure by using the first top coat film Tc1 formed on the second top coat film Tc2 which covers the photosensitive material film Rg.

After the first exposure is completed for the substrate P in the first station EX1, the substrate P, for which the first exposure has been completed, is transported by the transport system H to the coater/developer apparatus CD. As shown in FIG. 5(E), the first top coat film Tc1 is removed by the removing unit J from the substrate P which has been transported to the coater/developer apparatus CD. That is, the removing unit J removes (strips), before performing the second exposure, the first top coat film Tc1 disposed on the photosensitive material film Rg on the base material W after the completion of the first exposure. In this case, the second top coat film Tc2 is not removed. The second top coat film Tc2 is formed on the photosensitive material film Rg on the base material W.

After the first top coat film Tc1 is removed, the substrate P, on which the second top coat film Tc2 is formed on the photosensitive material film Rg, is transported to the second station EX2 by the control unit 7 by the aid of the transport system H. As shown in FIG. 5(F), the control unit 7 forms a liquid immersion area LR2 of the second liquid LQ2 on the substrate P to execute the second exposure for the predetermined area on the substrate P (Step SB6). As described above, the second exposure is executed in the second station EX2 for the predetermined area on the substrate P for which the first exposure has been executed in the first station EX1. Accordingly, the predetermined area on the substrate P is subjected to the multiple exposure (double exposure in this embodiment). The second top coat film Tc2, which is used in the second exposure, is a film adapted to the second liquid LQ2. The second station EX2 executes the second exposure by using the second top coat film Tc2.

After the second exposure is completed for the substrate P in the second station EX2, the substrate P, for which the second exposure has been completed, is transported by the transport system H to the coater/developer apparatus CD. The substrate P, for which the second exposure has been completed, is transported to the developer unit D by the transport system H in order that the substrate P, for which the second exposure has been completed, is developed by the developing solution in the developer unit D.

The substrate P, for which the second exposure has been completed, is transported to the developer unit D. It is judged whether or not the second top coat film Tc2 is soluble in the developing solution on the basis of, for example, the information previously stored, for example, in the control unit 7 (Step SB7). Since Steps SB7 to SB14 shown in the flow chart of FIG. 4 are the same as or equivalent to Steps SA7 to SA14 shown in the flow chart of FIG. 2, any explanation of which is omitted. It is also allowable that Steps SB7, SB10 are not performed in the process flow of this embodiment, similarly to the first embodiment described above.

In the second embodiment, the first and second top coat films Tc1, Tc2, which are adapted to the first and second liquids LQ1, LQ2, are used. Additionally, the photosensitive material film Rg is not exposed during the first exposure and the second exposure as well. The surface of the photosensitive material film Rg can be protected by both of the first and second top coat films Tc1, Tc2 or by the second top coat film Tc2.

In the first and second embodiments described above, the coater/developer apparatus CD, which is common to the first station EX1 and the second station EX2, is used. However, the coater/developer apparatus CD may be arranged for each of the first station EX1 and the second station EX2. In this case, the operations, which are performed by the common coater/developer apparatus CD in the first and second embodiments described above, may be appropriately divided and allotted.

Third Embodiment

Figure 6:
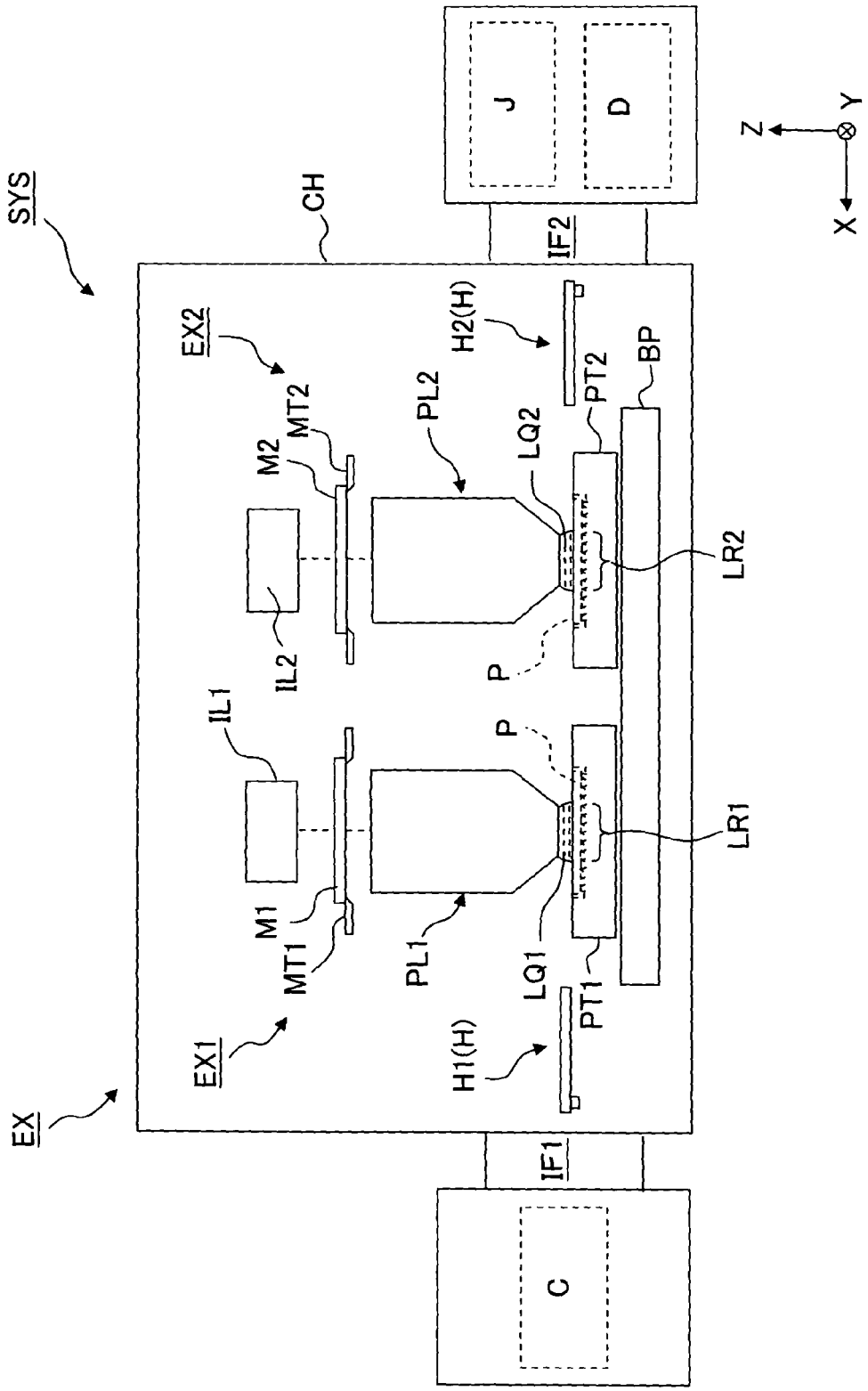
FIG. 6 shows a schematic arrangement illustrating a device-producing system provided with an exposure apparatus according to a third embodiment.

Next, a third embodiment will be explained. FIG. 6 shows an embodiment of a device-producing system SYS provided with an exposure apparatus EX according to the third embodiment. With reference to FIG. 6, the device-producing system SYS includes the exposure apparatus EX for exposing a substrate P, a coating unit C for forming a predetermined film on the substrate P, a developer unit D for developing the substrate P, and a transport system H for transporting the substrate P. In the following description, the constitutive components or parts, which are same as or equivalent to those of the embodiment described above, are designated by the same reference numerals, any explanation of which will be simplified or omitted.

The exposure apparatus EX is the exposure apparatus for performing the multiple exposure for the substrate P. The exposure apparatus EX includes a first station EX1 for exposing the substrate P; and a second station EX2 for exposing the substrate P, having been exposed in the first station EX1, without performing the development process step.

The first station EX1 includes a first mask stage MT1 which is movable while holding a first mask M1, a first illumination system IL1 which illuminates, with an exposure light beam EL, the first mask M1 held by the first mask stage MT1, and a first projection optical system PL1 which projects, onto the substrate P, an image of a pattern of the first mask M1 illuminated with the exposure light beam EL. The second station EX2 includes a second mask stage MT2 which is movable while holding a second mask M2, a second illumination system IL2 which illuminates, with an exposure light beam EL, the second mask M2 held by the second mask stage MT2, and a second projection optical system PL2 which projects, onto the substrate P, an image of a pattern of the second mask M2 illuminated with the exposure light beam EL.

The first station EX1 and the second station EX2 are provided adjacently. The first substrate stage PT1 and the second substrate stage PT2 are movable independently from each other while holding the substrate P in a predetermined area including a first area in which the exposure light beam EL can be radiated onto the substrate P in the first station EX1 and a second area in which the exposure light beam EL can be radiated onto the substrate P in the second station EX2. That is, the first substrate stage PT1 is movable on a base member BP while holding the substrate P between a position (first exposure position) at which the first substrate stage PT1 is opposite to or facing a last (end) optical element of the first projection optical system PL1 and a position (second exposure position) at which the first substrate stage PT1 is opposite to a last (end) optical element of the second projection optical system PL2. The second substrate stage PT2 is movable on the base member BP while holding the substrate P between the second exposure position at which the second substrate stage PT2 is opposite to the last optical element of the second projection optical system PL2 and the first exposure position at which the second substrate stage PT2 is opposite to the last optical element of the first projection optical system PL1. FIG. 6 shows a state in which the first substrate stage PT1 is arranged in the first area of the first station EX1, and the second substrate stage PT2 is arranged in the second area of the second station EX2.

At least parts of the illumination optical systems, the mask stages, the projection optical systems, the substrate stages, and other components of the first and second stations EX1, EX2 are accommodated in a chamber apparatus CH.

In this embodiment, the coating unit C and the developer unit D are provided away from each other. The coating unit C is arranged at a position near to the first station EX1, and the developer unit D is arranged at a position near to the second station EX2. The exposure apparatus EX is connected to the coating unit C via a first interface IF1, and the exposure apparatus EX is connected to the developer unit D via a second interface IF2.

The developer unit D includes a removing unit J which removes the predetermined film formed on the base material of the substrate P. The developer unit D also includes a bake unit (not shown) which performs the heat treatment for the substrate P.

The transport system H includes a first transport system H1 which transports the substrate P between the first interface IF1 and the first station EX1, and a second transport system H2 which transports the substrate P between the second interface IF2 and the second station EX2. The first transport system H1 has such a function that the substrate P before being subjected to the exposure is loaded onto the substrate stage to be arranged in the first station EX1. The second transport system H2 has such a function that the substrate P after being subjected to the exposure in the second station EX2 is unloaded from the substrate stage. Although not shown, the transport system H also includes a third transport system which transports the substrate P between the first interface IF1 and the coating unit C, and a fourth transport system which transports the substrate P between the second interface IF2 and the developer unit D. That is, the transport system H is capable of transporting the substrate P among the coating unit C, the first and second stations EX1, EX2, and the developer unit D.

The first station EX1 and the second station EX2 execute the liquid immersion exposure for radiating the exposure light beam EL onto the substrate P via the liquid respectively. In the first station EX1, the liquid immersion area LR1 of the first liquid LQ1 is formed on the substrate P, and the first exposure is executed for the predetermined area on the substrate P. In the second station EX2, the second liquid LQ2, which is different from the first liquid LQ1, is used to form the liquid immersion area LR2 thereof on the substrate P for which the first exposure has been executed in the first station EX1, and the second exposure is executed for the predetermined area on the substrate P.

In this embodiment, the substrate P, on which the predetermined film has been formed by the coating unit C, is loaded, for example, on the first substrate stage PT1 of the first station EX1. The control unit 7 executes the first exposure for the substrate P held by the first substrate stage PT1 in the first station EX1. After that, the first substrate stage PT1 is moved to the second station EX2. The second exposure is executed for the substrate P held by the first substrate stage PT1 in the second station EX2. The substrate P, for which the second exposure has been completed, is unloaded from the first substrate stage PT1. After that, the substrate P is transported to the developer unit D in order to perform the development. After the substrate P is unloaded, the first substrate stage PT1 is moved to the first station EX1, and the first substrate stage PT1 receives a new substrate P (before being subjected to the exposure) from the coating unit C. On the other hand, the second exposure is executed for the substrate P disposed on the second substrate stage PT2 in the second station EX2 during the period in which the first exposure is executed for the substrate P disposed on the first substrate stage PT1 in the first station EX1. The substrate P, which is disposed on the second substrate stage PT2, has been already subjected to the first exposure in the first station EX1. The second substrate stage PT2 delivers the substrate P for which the second exposure has been completed to the developer unit D (second transport system H2) in the same manner as the first substrate stage PT1. After that, the second substrate stage PT2 is moved to the first station EX1 in order to receive a new substrate P (before being subjected to the exposure) from the coating unit C.

Figure 7:
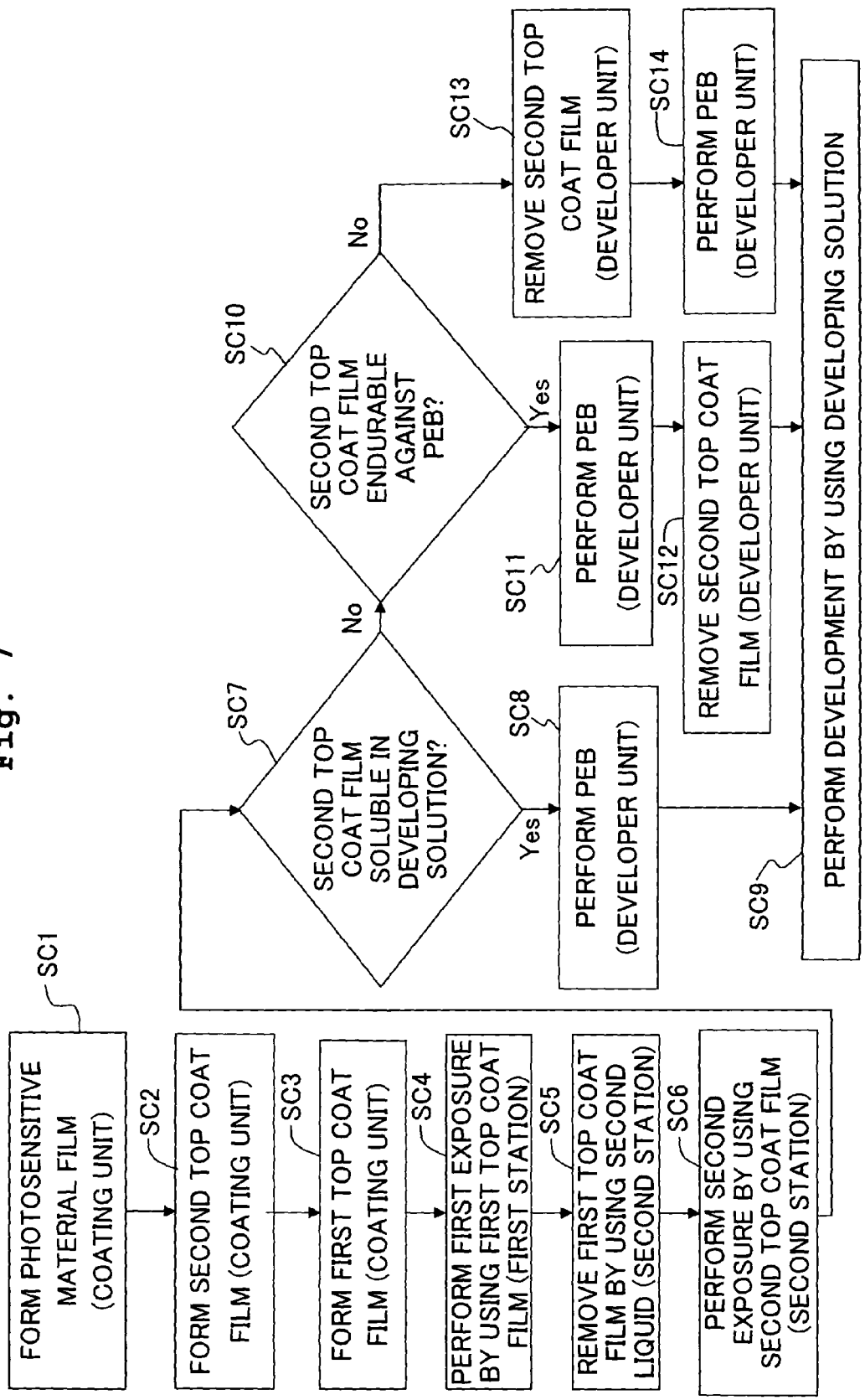
FIG. 7 shows a flow chart illustrating a processing procedure according to the third embodiment.
Figure 8:
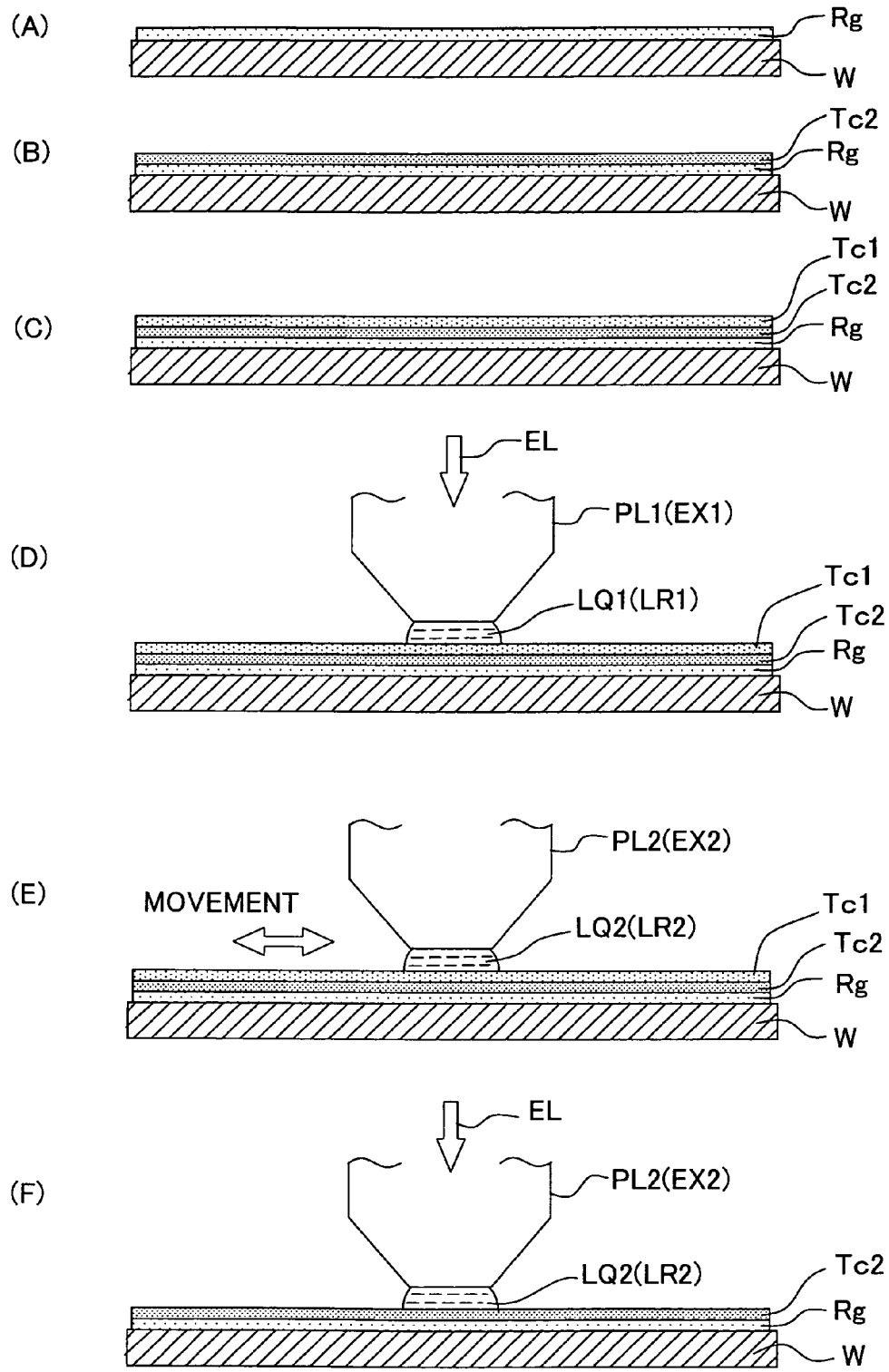
FIGS. 8(A) to 8(F) schematically illustrate the processing procedure according to the third embodiment.

Next, an explanation will be made with reference to a flow chart shown in FIG. 7 and a schematic illustration shown in FIG. 8 about the operation for processing the substrate P by using the device-producing system SYS including the exposure apparatus EX constructed as described above.

The first top coat film Tc1, which is used in this embodiment, is soluble in the second liquid LQ2. The second liquid LQ2 is capable of removing the first top coat film Tc1 from the surface of the substrate P by dissolving the first top coat film Tc1 disposed on the substrate P.

At first, as shown in FIG. 8(A), a photosensitive material film Rg is formed on a base material W of the substrate P by the coating unit C (Step SC1).

Subsequently, as shown in FIG. 8(B), the second top coat film Tc2 is formed on the photosensitive material film Rg on the base material W by the coating unit C (Step SC2).

Subsequently, as shown in FIG. 8(C), the first top coat film Tc1 is formed, by the coating unit C, on the second top coat film Tc2 on the photosensitive material film Rg on the base material W (Step SC3).

Subsequently, the substrate P, on which the photosensitive material film Rg and the first and second top coat films Tc1, Tc2 have been formed, is loaded on the first substrate stage PT1 (or the second substrate stage PT2) in the first station EX1 by the control unit 7 by the aid of the transport system H. As shown in FIG. 8(D), the control unit 7 forms a liquid immersion area LR1 of the first liquid LQ1 on the first top coat film Tc1 of the substrate P to execute the first exposure for the predetermined area on the substrate P (Step SC4).

After the first exposure is completed for the substrate P in the first station EX1, the first substrate stage PT1 (or the second substrate stage PT2), which holds the substrate P, is arranged by the control unit 7 at the position opposite to a last (end) optical element of the second projection optical system PL2 of the second station EX2. As shown in FIG. 8(E), the control unit 7 forms the liquid immersion area LR2 of the second liquid LQ2 on the substrate P, and the first top coat film Tc1 is removed by using the second liquid LQ2. As described above, the first top coat film Tc1, which is used in this embodiment, is soluble in the second liquid LQ2. The second liquid LQ2 is capable of removing the first top coat film Tc1. In order to remove the first top coat film Tc1, the control unit 7 moves the first substrate stage PT1 (or the second substrate stage PT2) in the XY directions with respect to the liquid immersion area LR2 of the second liquid LQ2 so that the second liquid LQ2 makes contact with the entire area of the first top coat film Tc1. As described above, in this embodiment, the second liquid LQ2 is used to remove, before performing the second exposure, the first top coat film Tc1 disposed on the photosensitive material film Rg on the base material W after the completion of the first exposure. In this case, the second top coat film Tc2 is not removed by the second liquid LQ2. The second top coat film Tc2 is formed on the photosensitive material film Rg on the base material W.

The first top coat film Tc1 is removed by using the second liquid LQ2, and the second liquid LQ2, which has been used to remove the first top coat film Tc1, is recovered. After that, as shown in FIG. 8(F), the control unit 7 executes the second exposure for the predetermined area on the substrate P in a state in which a liquid immersion area LR2 of the second liquid LQ2 is formed on the substrate P (Step SC6). As described above, the second exposure is executed in the second station EX2 for the predetermined area on the substrate P for which the first exposure has been executed in the first station EX1. Accordingly, the predetermined area on the substrate P is subjected to the multiple exposure (double exposure in this embodiment).

After the completion of the second exposure for the substrate P in the second station EX2, the substrate P, for which the second exposure has been completed, is transported to the developer unit D by the transport system H. The substrate P, for which the second exposure has been completed, is transported to the developer unit D by the transport system H in order that that the substrate P, for which the second exposure has been completed, is developed by using the developing solution in the developer unit D.

The substrate P, for which the second exposure has been completed, is transported to the developer unit D, and it is judged whether or not the second top coat film Tc2 is soluble in the developing solution, for example, on the basis of the information previously stored, for example, in the control unit 7 (Step SC7). Since Steps SC7 to SC14 shown in the flow chart of FIG. 7 are substantially same as or equivalent to Steps SA7 to SA14 shown in the flow chart of FIG. 2 and Steps SB7 to SB14 shown in the flow chart of FIG. 4, any explanation of which is omitted. It is also allowable that Steps SC7, SC10 are not performed in the process flow of this embodiment, similarly to the first and second embodiments described above.

Also in the third embodiment, the top coat films Tc1, Tc2, which are suitable for the first and second liquids LQ1, LQ2, are used. Additionally, the photosensitive material film Rg is not exposed as well during the period between the first exposure and the second exposure. The surface of the photosensitive material film Rg can be protected by both of the first and second top coat films Tc1, Tc2 or by the second top coat film Tc2. In the third embodiment, it is unnecessary to transport the substrate P to any peripheral apparatus such as the coater/developer apparatus between the first exposure and the second exposure. Therefore, the multiple exposure process for the substrate P, which is based on the use of the different liquids, can be executed at a high throughput.

In this embodiment, the first top coat film Tc1 is removed by using the second liquid LQ2 (Step SC5), and then the second exposure is executed by using the second liquid LQ2 (Step SC6). However, the second exposure may be executed while removing the first top coat film Tc1 with the second liquid LQ2. That is, the operation of Step SC5 and at least a part of the operation of Step SC6 may be performed concurrently. For example, when the first top coat film Tc1 is soluble in the second liquid LQ2 extremely easily, the first top coat film Tc1 is dissolved and removed with the second liquid LQ2 in the vicinity of the outer circumference of the liquid immersion area LR2 of the second liquid LQ2. Therefore, the portion of the surface of the substrate P, from which the first top coat film Tc1 is removed, is successfully allowed to arrive at the vicinity of the central portion of the liquid immersion area LR2 onto which the exposure light beam EL is to be radiated.

Fourth Embodiment

Figure 9:
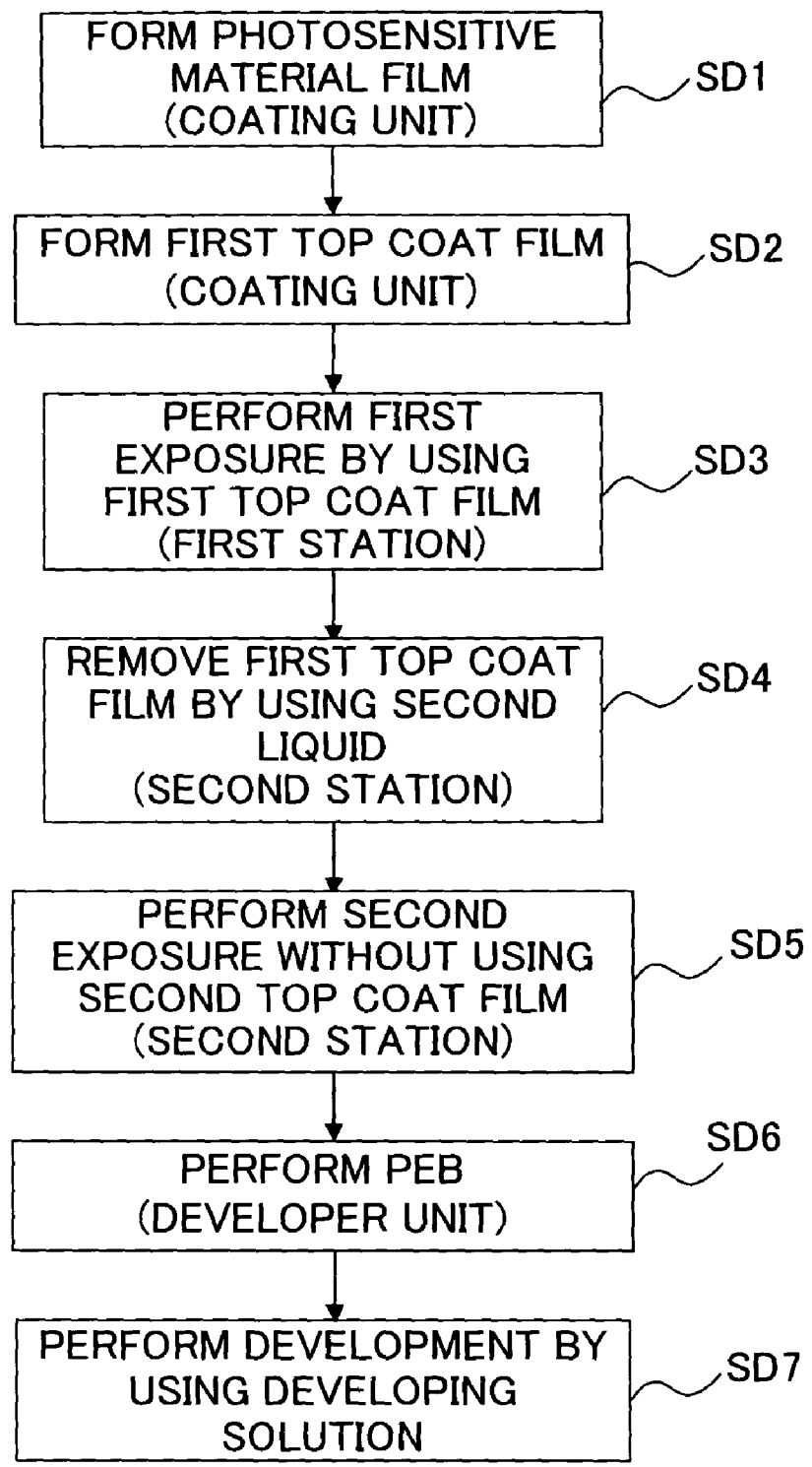
FIG. 9 shows a flow chart illustrating a processing procedure according to a fourth embodiment.

Next, a fourth embodiment will be explained with reference to a flow chart shown in FIG. 9 and a schematic illustration shown in FIG. 10. The device-producing system SYS explained with reference to FIG. 6 is also used in the fourth embodiment. The first top coat film Tc1, which is used in this embodiment, is also soluble in the second liquid LQ2. That is, the second liquid LQ2 is capable of removing, from the surface of the substrate P, the first top coat film Tc1 disposed on the substrate P. In the following description, the constitutive components or parts, which are the same as or equivalent to those of the embodiment described above, are designated by the same reference numerals, any explanation of which will be simplified or omitted.

At first, as shown in FIG. 10(A), a photosensitive material film Rg is formed on a base material W of the substrate P by the coating unit C (Step SD1).

Subsequently, as shown in FIG. 10(B), a first top coat film Tc1 is formed on the photosensitive material film Rg on the base material W by the coating unit C (Step SD2).

Subsequently, the substrate P, on which the photosensitive material film Rg and the first top coat film Tc1 have been formed, is loaded on the first substrate stage PT1 (or the second substrate stage PT2) in the first station EX1 by the control unit 7 by the aid of the transport system H. As shown in FIG. 10(C), the control unit 7 forms a liquid immersion area LR1 of the first liquid LQ1 on the first top coat film Tc1 of the substrate P to execute the first exposure for the predetermined area on the substrate P (Step SD3).

After the first exposure is completed for the substrate P in the first station EX1, the first substrate stage PT1 (or the second substrate stage PT2), which holds the substrate P, is arranged by the control unit 7 at a position opposite to a last (end) optical element of the second projection optical system PL2 of the second station EX2. As shown in FIG. 10(D), the control unit 7 forms a liquid immersion area LR2 of the second liquid LQ2 on the substrate P, and the first top coat film Tc1 is removed by using the second liquid LQ2. As described above, in this embodiment, the second liquid LQ2 is used to remove, before performing the second exposure, the first top coat film Tc1 disposed on the photosensitive material film Rg on the base material W after the completion of the first exposure. In this embodiment, the second top coat film Tc2 is not formed on the photosensitive material film Rg. The photosensitive material film Rg, which is disposed on the base material W, is exposed by removing the first top coat film Tc1.

After the first top coat film Tc1 is removed by using the second liquid LQ2, as shown in FIG. 10(E), the control unit 7 forms a liquid immersion area LR2 of the second liquid LQ2 on the photosensitive material film Rg of the substrate P without using the second top coat film Tc2 to execute the second exposure for the predetermined area on the substrate P (Step SD5). As described above, the second exposure is executed in the second station EX2 for the predetermined area on the substrate P for which the first exposure has been executed in the first station EX1. Accordingly, the predetermined area on the substrate P is subjected to the multiple exposure (double exposure in this embodiment).

After the completion of the second exposure for the substrate P in the second station EX2, the substrate P, for which the second exposure has been completed, is transported to the developer unit D by the transport system H. The substrate P, for which the second exposure has been completed, is transported to the developer unit D by the transport system H in order that that the substrate P, for which the second exposure has been completed, is developed by using the developing solution in the developer unit D.

The substrate P, which is transported to the developer unit D after the completion of the second exposure, is subjected to the predetermined process such as PEB as described above (Step SD6), and then the substrate P is developed by using the developing solution (Step SD7).

As described above, it is also allowable that any one of the top coat films Tc1, Tc2 is not used in some cases depending on the characteristic (physical property) of the liquid (LQ1 or LQ2). That is, the fourth embodiment is preferred for such a case that the photosensitive material film Rg desirably forms the surface of the substrate P in the second exposure in consideration of the affinity for the second liquid LQ2 and/or the durability against the second liquid LQ2. In other words, it is appreciated that the combination of the second liquid LQ2 and the photosensitive material film Rg is optimized. In this case, it is possible to omit the step of forming the second top coat film Tc2 beneath the first top coat film Tc1. Therefore, it is possible to shorten the period of time required to process the substrate P as compared with the third embodiment. Also in the fourth embodiment, it is unnecessary to transport the substrate P to any peripheral apparatus such as the coater/developer apparatus in order to remove the first top coat film Tc1 between the first exposure and the second exposure. Therefore, the multiple exposure process for the substrate P, which is based on the use of the different liquids, can be executed at a high throughput.

In this embodiment, the first top coat film Tc1 is removed by using the second liquid LQ2 (Step SD4), and then the second exposure is executed by using the second liquid LQ2 (Step SD5). However, the second exposure may be executed while removing the first top coat film Tc with the second liquid LQ2. That is, the operation of Step SD4 and at least a part of the operation of Step SD5 may be performed concurrently. For example, when the first top coat film Tc1 is soluble in the second liquid LQ2 extremely easily, the first top coat film Tc1 is dissolved and removed with the second liquid LQ2 in the vicinity of the outer circumference of the liquid immersion area LR2 of the second liquid LQ2. Therefore, a portion of the surface of the substrate P, from which the first top coat film Tc1 is removed, is successfully allowed to arrive at the vicinity of the central portion of the liquid immersion area LR2 onto which the exposure light beam EL is to be radiated.

In this embodiment, the second top coat film Tc2 is not used in the second exposure. However, it is also allowable that the surface of the substrate P is formed with the photosensitive material film Rg without using the first top coat film Tc1 in the first exposure, depending on, for example, the affinity for the first liquid LQ1 and/or the durability against the first liquid LQ1. In this case, the first exposure may be performed for the substrate on which the photosensitive material film Rg is formed, and then the substrate, on which the second top coat film Tc2 is formed on the photosensitive material film Rg, for example, by the coating unit C, may be subjected to the loading on the second substrate stage PT2 of the second station EX2.

In the third and fourth embodiments described above, the first exposure is performed for the substrate P disposed on the first substrate stage (or the second substrate stage), and then the first substrate stage (or the second substrate stage) is moved to the second station EX2 while holding the substrate P to perform the second exposure. However, for example, a transport unit, which is capable of transporting the substrate P between the first station EX1 and the second station EX2, may be provided. For example, the first exposure may be executed for the substrate P disposed on the first substrate stage PT1 in the first station EX1, and then the substrate P may be unloaded from the first substrate stage PT1 by using the transport unit after the execution of the first exposure. The substrate P may be loaded on the second substrate stage PT2 arranged in the second station EX2. The second exposure may be executed in the second station EX2 for the substrate P held by the second substrate stage PT2.

An explanation will be made below about the liquids (LQ1, LQ2) capable of being used in the respective embodiments. As for the first and second liquids LQ1, LQ2, it is also allowable to use, for example, liquids in which the refractive indexes are different from each other with respect to the exposure light beam EL (ArF excimer laser light beam, wavelength: 193 nm), liquids in which the transmittances are different from each other with respect to the exposure light beam EL, liquids in which the viscosities are different from each other, and liquids in which the temperatures are different from each other.

As for the liquids (LQ1, LQ2), it is possible to use water (pure or purified water). For example, it is also possible to use liquids in which the refractive index is higher than the refractive index of the last optical element of the projection optical system (PL1, PL2) with respect to the exposure light beam EL.

In the following description, the refractive index of the liquid LQ1, LQ2 with respect to the exposure light beam EL is appropriately referred to as "refractive index of the liquid", and the refractive index of the last optical element of the projection optical system PL1, PL2 with respect to the exposure light beam EL is appropriately referred to as "refractive index of the last optical element" for the purpose of simplification. The liquid, which has the refractive index higher than the refractive index (about 1.44) of pure water with respect to the exposure light beam EL, is appropriately referred to as "high refractive index liquid".

In the respective embodiments described above, the high refractive index liquid can be used as at least one of the first and second liquids LQ1, LQ2. For example, when the last optical element is formed of silica glass, any liquid, which has the refractive index of, for example, about 1.6 to 2.0 which is higher than the refractive index of silica glass, is used as the high refractive index liquid, because the refractive index of silica glass is about 1.5. That is, the pure water can be used as the first liquid, and the high refractive index liquid can be used as the second liquid.

The liquid (high refractive index liquid) includes, for example, predetermined liquids having the C—H bond or the O—H bond such as isopropanol having a refractive index of about 1.50 and glycerol (glycerin) having a refractive index of about 1.61, and predetermined liquids (organic solvents) such as hexane, heptane, and decane. It is also preferable to use liquids obtained by mixing arbitrary two or more liquids of the predetermined liquids and liquids obtained by adding (mixing) the predetermined liquid or liquids to (with) pure water. Alternatively, as for the liquid, it is also preferable to use liquids obtained by adding (mixing) base or acid such as $H^+$, $Cs^+$, $K^+$, $Cl^-$, $SO_4^{2-}$, and $PO_4^{2-}$ to (with) pure water. Further, it is also preferable to use liquids obtained by adding (mixing) fine particles of Al oxide or the like to (with) pure water. The ArF excimer laser light beam is transmissive through the liquid as described above. As for the liquid, it is preferable to use liquids which have the small coefficients of light absorption, which have the small temperature dependency, and which are stable against the photosensitive material coated on the surface of the substrate P and the projection optical system.

The last optical element can be formed of, for example, silica glass (silica). Alternatively, the last optical element may be formed of single crystal materials of fluorine compounds such as calcium fluoride (calcium fluorite), barium fluoride, strontium fluoride, lithium fluoride, and sodium fluoride. Optical elements other than the last optical element, which are included in the projection optical system, can be formed of the material as described above. For example, any optical element other than the last optical element may be formed of calcium fluoride, and the last optical element may be formed of silica glass. Any optical element other than the last optical element may be formed of silica glass, and the last optical element may be formed of calcium fluoride. All of the optical elements of the projection optical system may be formed of silica glass (or calcium fluoride).

As for the optical elements of the projection optical system including the last optical element, the last optical element may be formed of a material having a refractive index higher than those of silica glass and calcium fluoride (for example, a refractive index of not less than 1.6). The optical element of the projection optical system can be formed by using, for example, sapphire or germanium dioxide as disclosed, for example, in International Publication No. 2005/059617. Alternatively, the optical element of the projection optical system can be formed by using, for example, potassium chloride (refractive index: about 1.75) as disclosed in International Publication No. 2005/059618.

The refractive index of the liquid may be higher than the refractive index of the last optical element, and the numerical aperture NA of the projection optical system may be higher than the refractive index of the last optical element.

In the respective embodiments described above, for example, the pure water may be used as the first liquid LQ1 to be used for the first exposure, and the high refractive index liquid may be used as the second liquid LQ2 to be used for the second exposure. Alternatively, the high refractive index liquid may be used as the first liquid LQ1 to be used for the first exposure, and the pure water may be used as the second liquid LQ2 to be used for the second exposure. Further alternatively, a first high refractive index liquid may be used as the first liquid LQ1 to be used for the first exposure, and a second high refractive index liquid may be used as the second liquid LQ2 to be used for the second exposure. The first top coat film Tc1, which is used for the first exposure, may be determined depending on the first liquid LQ1, and the second top coat film Tc2, which is used in the second exposure, may be determined depending on the second liquid LQ2. Of course, as described above, it is also allowable that any one of the top coat films is not used.

When the first projection optical system PL1 has a first numerical aperture, the second projection optical system PL2 has a second numerical aperture, and the first numerical aperture is larger than the second numerical aperture, then it is desirable that the photosensitive material (photoresist) to be employed, which has the refractive index larger than the first numerical aperture, is used. That is, when the exposure light beam is radiated onto the photosensitive material by using a plurality of projection optical systems, it is desirable to use the photosensitive material which has the refractive index higher than the maximum numerical aperture of the plurality of projection optical systems. For example, when the numerical aperture of the projection optical system is 1.6, it is desirable to use the photosensitive material which has the refractive index larger than 1.6. Accordingly, it is possible to satisfactorily radiate the exposure light beam onto the photosensitive material via the projection optical system.

Figure 11:
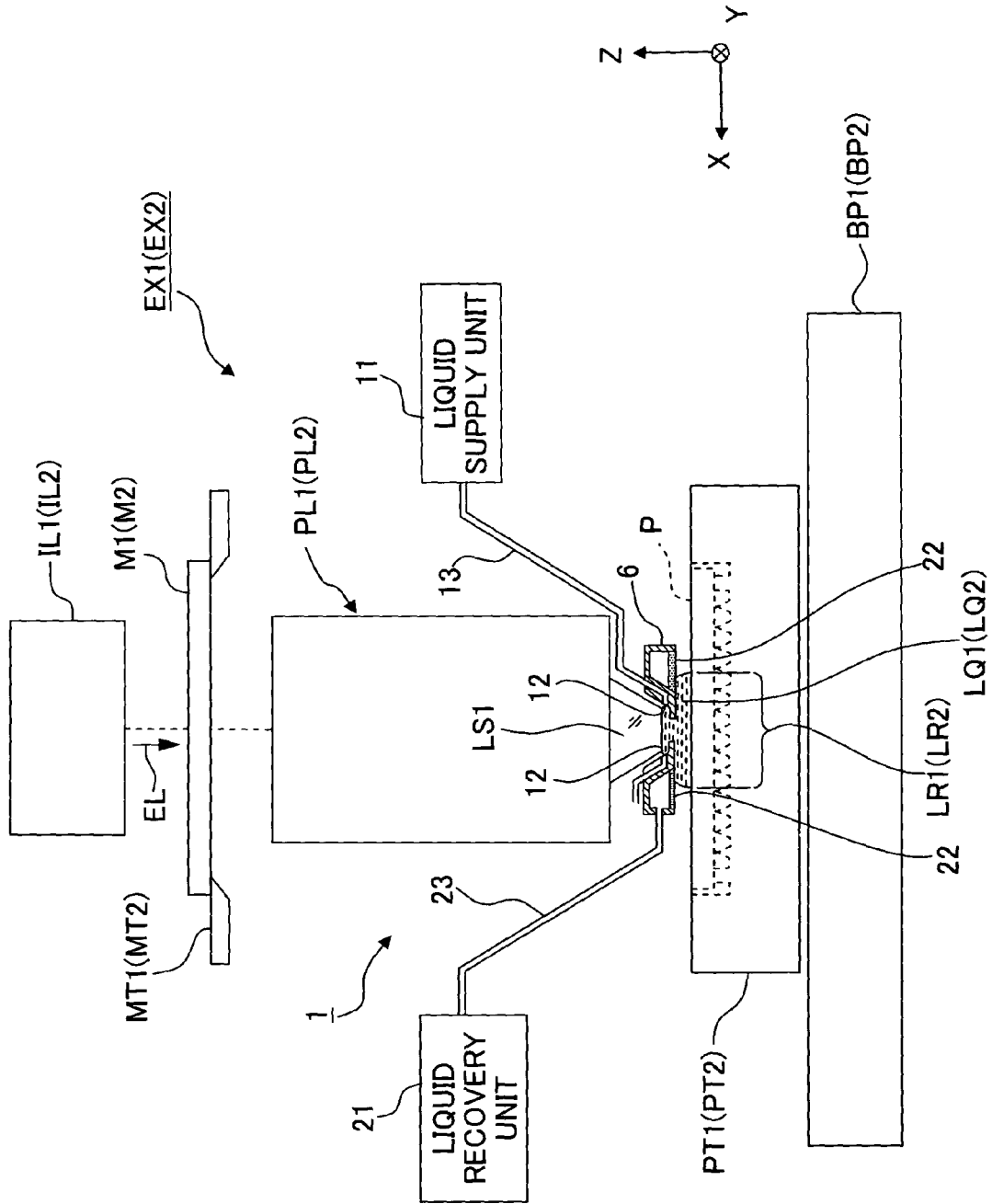
FIG. 11 shows a schematic arrangement illustrating an exemplary exposure apparatus.

FIG. 11 shows an example of the station EX1 (or EX2). The station EX1 (EX2) shown in FIG. 11 is provided with a liquid immersion system 1 which fills, with the liquid LQ1 (LQ2), the optical path for the exposure light beam EL on a side of the image plane of the projection optical system PL1 (PL2). The liquid immersion system 1 includes a nozzle member 6 which is provided in the vicinity of the optical path for the exposure light beam EL on the side of the image plane of the projection optical system PL1 (PL2) and which has a supply port 12 for supplying the liquid LQ1 (LQ2) to the optical path and a recovery port 22 for recovering the liquid LQ1 (LQ2), a liquid supply unit 11 which supplies the liquid LQ via a supply tube 13 and the supply port 12 of the nozzle member 6, and a liquid recovery unit 21 which recovers the liquid LQ via the recovery port 22 of the nozzle member 6 and a recovery tube 23. The nozzle member 6 is an annular member which is provided to surround the last optical element LS1 of the projection optical system PL1 (PL2). In this embodiment, the supply port 12 for supplying the liquid LQ1 (LQ2) is formed on the inner surface, of the nozzle member 6, directed toward the optical path, and the recovery port 22 for recovering the liquid LQ1 (LQ2) is formed on the lower surface, of the nozzle member 6, arranged opposite to the surface of the substrate P. The nozzle member 6 includes therein a flow passage (supply flow passage) for connecting the supply port 12 and the supply tube 13, and a flow passage (recovery flow passage) for connecting the recovery port 22 and the recovery tube 23. In this embodiment, a mesh member made of titanium or a porous member made of ceramics is arranged at an intermediate position of the recovery port 22 or the recovery flow passage. The operations of the liquid supply unit 11 and the liquid recovery unit 21 are controlled by the control unit 7. The liquid supply unit 11 is capable of feeding a clean and temperature-adjusted liquid LQ. The liquid recovery unit 21, which includes a vacuum system or the like, is capable of recovering the liquid LQ. The structure of the liquid immersion mechanism 1 including, for example, the nozzle member 6 is not limited to the structure as described above. It is possible to use those described, for example, in European Patent Publication No. 1420298, International Publication No. 2004/055803, International Publication No. 2004/057590, and International Publication No. 2005/029559 (corresponding to U.S. Patent Publication No. 2006/0231206). It is not necessarily indispensable that the exposure apparatus EX1 (EX2) is provided with all of the components or parts of the liquid immersion system 1. A part or parts of the liquid immersion system 1 (for example, the liquid supply unit 11 and the liquid recovery unit 21) may be substituted with the equipment of the device-manufacturing factory (clean room).

The station EX1 (EX2) forms the liquid immersion area LR1 (LR2) on the substrate P so that the optical path for the exposure light beam EL is filled with the liquid LQ1 (LQ2) by using the liquid immersion system 1 at least during the period of time in which the image of the pattern of the mask M is projected onto the substrate P. The station EX1 (EX2) projects the image of the pattern of the mask M onto the substrate P by radiating the exposure light beam EL allowed to pass through the mask M onto the substrate P via the projection optical system PL1 (PL2) and the liquid LQ1 (LQ2) of the liquid immersion area LR1 (LR2) formed on the substrate P.

Figure 12:
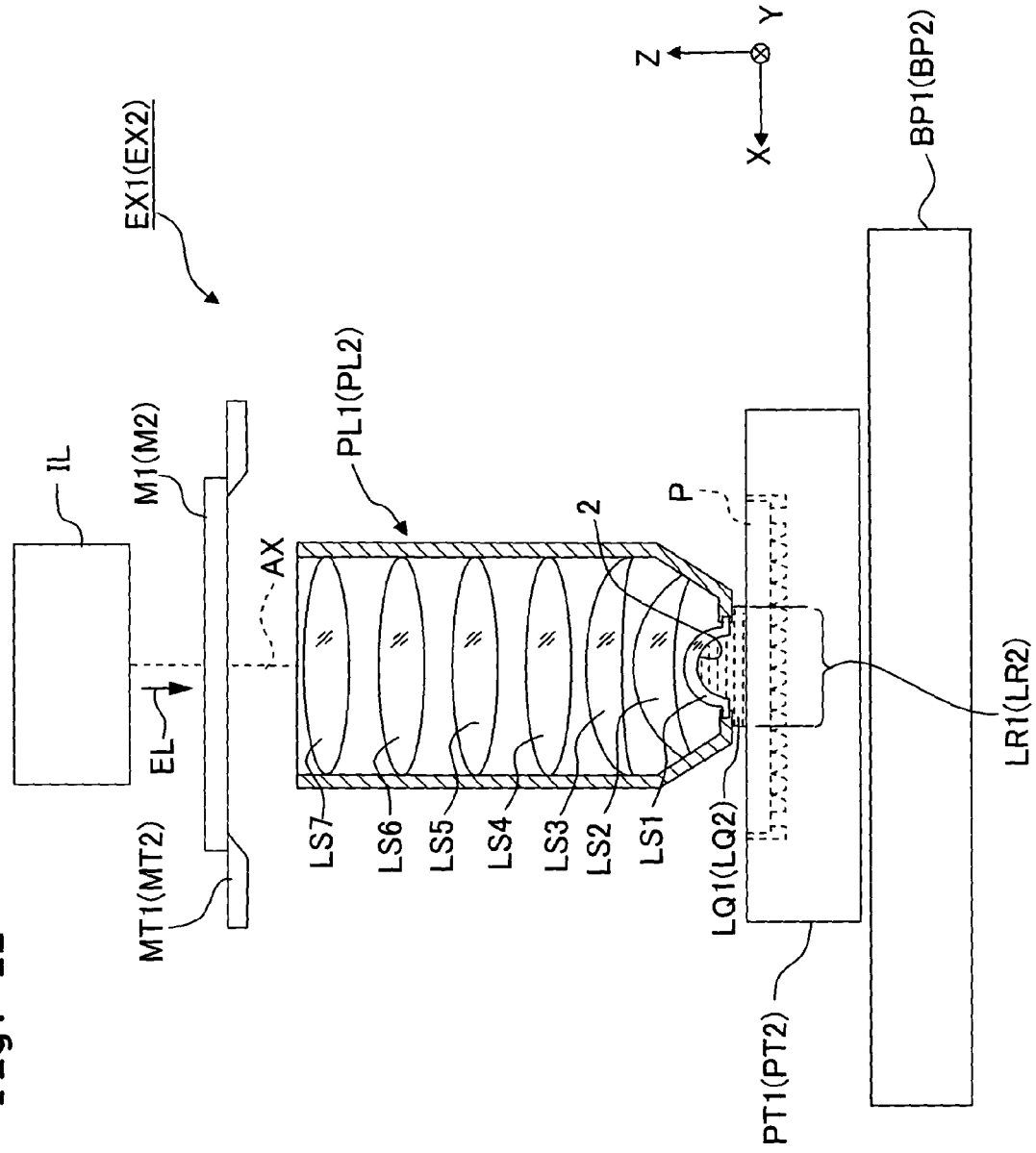
FIG. 12 shows a schematic arrangement illustrating an exemplary exposure apparatus.

FIG. 12 shows another example of the station EX1 (or EX2). The station EX1 (EX2) shown in FIG. 12 includes a projection optical system PL1 (PL2) having a plurality of optical elements (LS1 to LS7). In this embodiment, the last optical element LS1 has a concave surface 2 from which the exposure light beam EL is allowed to exit. A space, which is defined between the substrate P and the last optical element LS1 closest to the image plane of the projection optical system PL1 (PL2) among the plurality of optical elements LS1 to LS7, is filled with the liquid LQ1 (LQ2).

In the respective embodiments described above, the optical path, which is formed between the last optical element LS1 and a second optical element LS2 second closest to the image plane with respect to the last optical element among the plurality of optical elements of the projection optical system, may be filled with the liquid. In this case, the liquid, with which the space between the optical element LS1 and the optical element LS2 is filled, may be the same as or different from the liquid with which the space between the optical element LS1 and the substrate P is filled.

In the respective embodiments described above, the first and second top coat films Tc1, Tc2 may be provided with not only the function to protect the photosensitive material film Rg and/or the base material but also any other function including, for example, the antireflection function.

In the respective embodiments described above, the coating unit C may have nozzles corresponding to the photosensitive material film Rg and the first and second top coat films Tc1, Tc2 respectively, and the three nozzles may be used in different ways depending on, for example, the spin coat system and the scan coat system in the same chamber to form the predetermined film on the base material. Alternatively, a plurality of coating units may be provided depending on, for example, the type of the film to be formed on the base material. Similarly, in the respective embodiments described above, the device-producing system SYS may be provided with a plurality of developer units D and/or a plurality of removing units J depending on, for example, the type (characteristic) of the film as the processing objective on the substrate.

The present invention is also applicable, for example, to such a case that the substrate P is subjected to the multiple exposure with an exposure apparatus having one exposure station, rather than providing a plurality of stations (exposure apparatuses) like in the respective embodiments described above. Also in this case, the substrate P can be exposed by allowing the surface state of the substrate P to differ between the respective exposure processes (first and second exposure processes) of the multiple exposure in which the different liquids are used.

In the respective embodiments described above, the multiple exposure is performed such that the plurality of patterns are formed on the same photosensitive material film Rg without performing the development process. However, the present invention is also applicable to such a case that the exposure is performed a plurality of times in which the plurality of patterns are formed on different photosensitive material films respectively. In this case, it is allowable that the substrate processing such as the development process is not performed between the exposure processes to be executed a plurality of times. Alternatively, at least the development process may be performed to form a resist pattern on the substrate, and the photosensitive material film may be formed thereon to perform the next exposure process.

In the respective embodiments described above, when the substrate stage PT1 (PT2) leaves the station EX1 (EX2), then the liquid immersion area, which is formed on the substrate stage, may be moved to another member, and the liquid immersion area, which is disposed on the another member, may be moved to the substrate stage when the substrate stage is arranged next time. In this case, it is possible to improve the throughput of the exposure apparatus. The another member includes, for example, a movable member (for example, a measuring stage as described later on) which is movable independently from the substrate stage, and a lid member (cap) which is detachable with respect to the substrate stage and which is held by the nozzle member or the like when the substrate stage leaves the station.

In the respective embodiments described above, the ArF excimer laser is used as the exposure light beam EL. However, as described above, it is possible to adopt various exposure light beams (exposure beams) such as the $F_2$ laser. It is possible to appropriately use the optimum liquid depending on, for example, the exposure light beam (exposure beam) EL, the numerical aperture of the projection optical system PL, and the refractive index of the last optical element with respect to the exposure light beam EL. For example, when the exposure light beam EL is the $F_2$ laser, the $F_2$ laser beam is not transmitted through water. Therefore, liquids preferably usable as the liquid may include, for example, fluorine-based fluids such as fluorine-based oil and perfluoropolyether (PFPE) through which the $F_2$ laser beam is transmissive. It is also possible to use, as the liquid LQ, various fluids including, for example, supercritical fluid.

The substrate P, which is usable in the respective embodiments described above, is not limited to the semiconductor wafer for producing the semiconductor device. Those applicable include, for example, the glass substrate for the display device, the ceramic wafer for the thin film magnetic head, the master plate (synthetic silica glass, silicon wafer) for the mask or the reticle to be used for the exposure apparatus, or the film member. The shape of the substrate P is not limited to the circular shape. It is also allowable to use other shapes such as rectangular shapes.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P. In this case, it is also allowable to use a dioptric type projection optical system which has a reduction magnification of ⅛ and which includes no catoptric element.

In the exposure based on the step-and-repeat system, a reduction image of a first pattern may be transferred onto the substrate P in a state in which the first pattern and the substrate P are allowed to substantially stand still, and then the full field exposure may be performed on the substrate P by partially overlaying a reduction image of a second pattern with respect to the first pattern by using the projection optical system in a state in which the second pattern and the substrate P are allowed to substantially stand still (full field exposure apparatus based on the stitch system). As for the exposure apparatus based on the stitch system, the present invention is also applicable to the exposure apparatus based on the step-and-stitch system in which at least two patterns are partially overlaid and transferred on the substrate P, and the substrate P is successively moved. Even in the case of the stitch system, a plurality of patterns may be subjected to the exposure on the substrate by the scanning exposure respectively.

The present invention is also applicable to the exposure apparatus of the multistage type (twine-stage) exposure apparatus provided with a plurality of substrate stages as disclosed, for example, in Japanese Patent Application Laid-open Nos. 10-163099 and 10-214783 (corresponding to U.S. Pat. Nos. 6,341,007, 6,400,441, 6,549,269, and 6,590,634) and Published Japanese Translation of PCT International Publication for Patent Application No. 2000-505958 (corresponding to U.S. Pat. No. 5,969,441). In the respective embodiments described above, each of the first and second stations EX1, EX2 may be provided with a plurality of substrate stages. In the third and fourth embodiments described above, a third substrate stage may be provided in addition to the first and second substrate stages PT1, PT2. Any operation other than the exposure, which includes, for example, the load of the substrate and/or the position detection (detection of, for example, an alignment mark and a difference in height) as well as the unload of the substrate, may be performed on the third substrate stage during the period of time in which the first and second substrate stages PT1, PT2 are arranged in the first and second stations EX1, EX2 and the first exposure and the second exposure are performed for the different substrates respectively. In this case, the first, second, and third substrate stages are successively moved to the substrate load position, the first exposure position, the second exposure position, and the unload position respectively.

Further, the present invention is also applicable, for example, to the exposure apparatus provided with a measuring stage having a measuring member (for example, a reference mark and a sensor) as disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963).

The respective embodiments described-above have been explained as exemplified by the exposure apparatus provided with the projection optical system PL by way of example. However, the present invention is applicable to the exposure method and the exposure apparatus which do not use the projection optical system PL. Even when the projection optical system PL is not used as described above, then the exposure light beam is radiated onto the substrate via an optical member such as a lens, and the liquid immersion area is formed in the predetermined space between the substrate and the optical member as described above.

The type of the exposure apparatus EX is not limited to the exposure apparatus for producing the semiconductor element for exposing the substrate P with the semiconductor element pattern. The present invention is also widely applicable, for example, to the exposure apparatus for producing the liquid crystal display device or producing the display as well as to the exposure apparatus for producing, for example, the thin film magnetic head, the micromachine, MEMS, DNA chip, the image pickup element (CCD), the reticle, or the mask.

In the embodiments described above, the light-transmissive type mask is used, in which the predetermined light-shielding pattern (or phase pattern or dimming or light-reducing pattern) is formed on the light-transmissive substrate. However, in place of such a mask, as disclosed, for example, in U.S. Pat. No. 6,778,257, it is also allowable to use an electronic mask (also referred to as "variable shaped mask" including, for example, DMD (Digital Micro-mirror Device) as one type of the no light-emitting image display device (spatial light modulator)) on which a transmissive pattern, a reflective pattern, or a light-emitting pattern is formed on the basis of the electronic data of the pattern to be subjected to the exposure.

The present invention is also applicable to the exposure apparatus (lithography system) in which the substrate P is exposed with a line-and-space pattern by forming interference fringes on the substrate P as disclosed, for example, in International Publication No. 2001/035168. Further, the present invention is also applicable to the exposure apparatus in which patterns of two masks are combined on the substrate via the projection optical system, and one shot area on the substrate is subjected to the double exposure substantially simultaneously by one time of the scanning exposure as disclosed, for example, in Published Japanese Translation of PCT International Publication for Patent Application No. 2004-519850 (corresponding to U.S. Pat. No. 6,611,316).

The embodiment described above adopts the liquid immersion exposure apparatus which performs the exposure for the substrate in the state in which a part of the surface of the substrate P is locally subjected to the liquid immersion. However, the present invention is also applicable to the liquid immersion exposure apparatus which performs the exposure for the substrate in a state in which the entire surface of the substrate is subjected to the liquid immersion as disclosed, for example, in Japanese Patent Application Laid-open Nos. 6-124873 and 10-303114 and U.S. Pat. No. 5,825,043. In this case, it is also allowable that the system, in which a part of the surface of the substrate is allowed to be locally in the liquid immersion state, is adopted for one of the first exposure and the second exposure, and the system, in which the entire surface of the substrate is allowed to be in the liquid immersion state, is adopted for the other of the first exposure and the second exposure.

The foregoing explanation has been made as exemplified by the double exposure for the substrate P as the multiple exposure for the substrate P by way of example. It goes without saying that the present invention is not limited to the double exposure.

The disclosures of all of the above-mentioned patent documents (for example, the documents of International Publications, United States Patents, and United States Patent Publications, and the like) are incorporated herein by reference within a range of permission of the domestic laws and ordinances of the state designated or selected in this international application.

As described above, the exposure apparatus EX according to the embodiments of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 13:
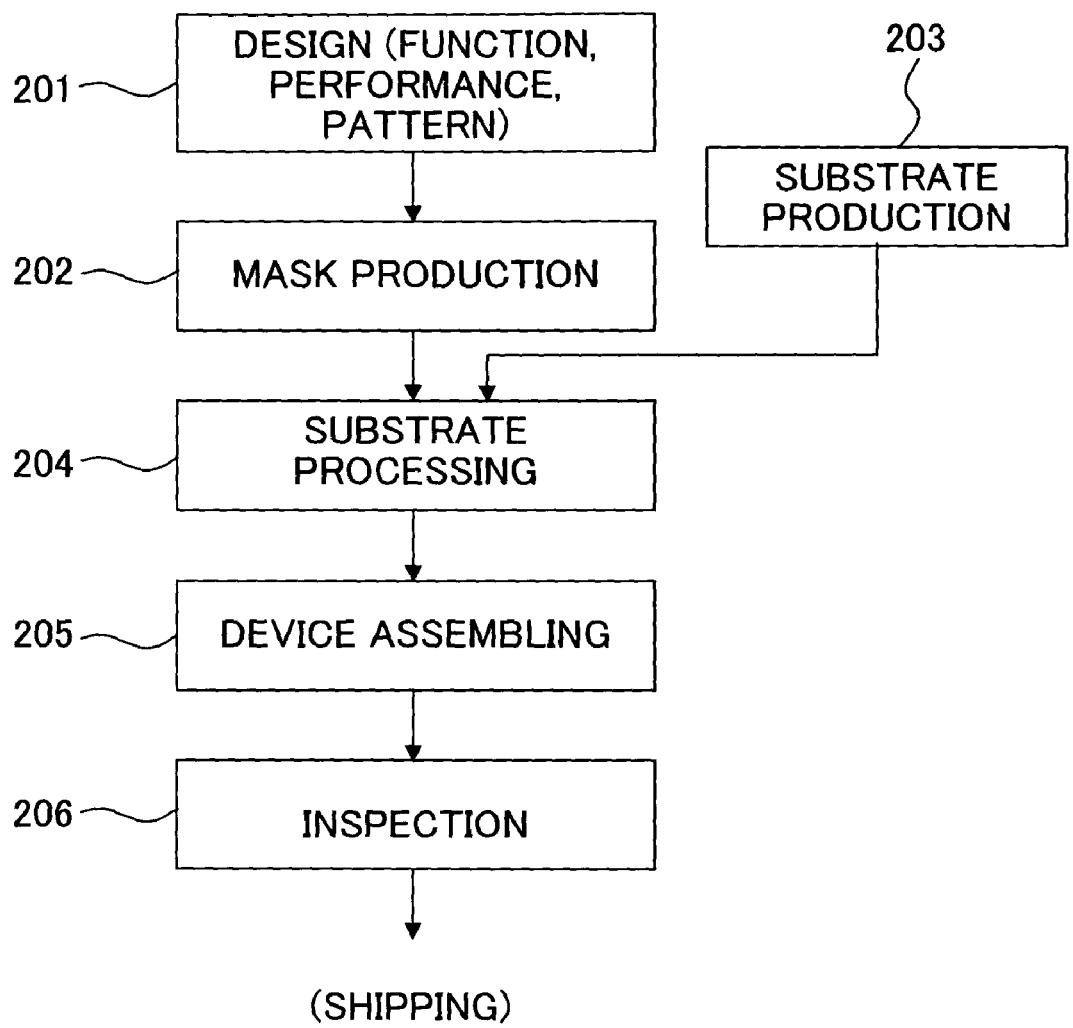
FIG. 13 shows a flow chart illustrating exemplary steps of producing a microdevice.

As shown in FIG. 13, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate-processing step 204 of exposing the substrate with a pattern of the mask by using the exposure apparatus EX of the embodiment described above, a step 205 of assembling the device (including process steps such as a dicing step, a bonding step, and a packaging step), and an inspection step 206. The substrate-processing step 204 includes the execution of the multiple exposure according to the present invention and the development for the substrate subjected to the multiple exposure.

According to the present invention, the first exposure and the second exposure (for example, the multiple exposure) can be performed satisfactorily by using the liquid immersion method, and it is possible to form the pattern having the high resolution on the substrate. In particular, the liquid immersion exposure process, in which the substrate is subjected to the multiple exposure by using the different liquids, is realized, and it is possible to produce, at a high yield, the device having the semiconductor circuit provided with the higher degree of integration. Therefore, the present invention extremely contributes to the development of the high technology equipment including, for example, the communication equipment and the semiconductor device such as IC.

What is claimed is:

1. An exposure method for exposing a predetermined area on a substrate, the exposure method comprising:
    executing first exposure for the predetermined area by forming a liquid immersion area of a first liquid on the substrate;
    executing second exposure for the predetermined area by forming a liquid immersion area of a second liquid different from the first liquid, on the substrate on which the first exposure has been executed; and
    making a surface state of the substrate in the second exposure different from a surface state of the substrate in the first exposure depending on the first and second liquids.

2. The exposure method according to claim 1, wherein:
    a surface of the substrate includes a surface of a film formed on a base material of the substrate; and
    the film used in the first exposure is different from the film used in the second exposure.

3. The exposure method according to claim 2, wherein the base material includes a semiconductor wafer.

4. The exposure method according to claim 2, wherein the film includes at least one of a film of a photosensitive material and a predetermined film which covers the film of the photosensitive material.

5. The exposure method according to claim 4, wherein:
    the predetermined film, which is used in the first exposure, is a first predetermined film; and
    the predetermined film, which is used in the second exposure, is a second predetermined film.

6. The exposure method according to claim 5, further comprising:
    performing an operation for developing the substrate by using a developing solution after completion of the second exposure, wherein the second predetermined film is soluble in the developing solution.

7. The exposure method according to claim 5, wherein:
    the first predetermined film is determined depending on the first liquid; and
    the second predetermined film is determined depending on the second liquid.

8. The exposure method according to claim 5, wherein the predetermined film is used in at least one of the first exposure and the second exposure.

9. The exposure method according to claim 5, wherein at least one of an operation for forming the predetermined film on the film of the photosensitive material on the base material and an operation for removing the predetermined film disposed on the film of the photosensitive material on the base material is executed between the first exposure and the second exposure.

10. The exposure method according to claim 9, wherein the operation for removing the predetermined film, which is performed between the first exposure and the second exposure, includes an operation for removing the first predetermined film having been used in the first exposure.

11. The exposure method according to claim 10, wherein the first predetermined film, used in the first exposure, is formed on the film of the photosensitive material.

12. The exposure method according to claim 11, wherein:
    the operation for forming the predetermined film, which is performed between the first exposure and the second exposure, includes an operation for removing the first predetermined film and then forming the second predetermined film on the film of the photosensitive material; and the second exposure is executed by using the second predetermined film.

13. The exposure method according to claim 11, wherein the second exposure is executed without using the second predetermined film after removing the first predetermined film.

14. The exposure method according to claim 13, wherein the first predetermined film is removed by using the second liquid.

15. The exposure method according to claim 10, wherein the first predetermined film, used in the first exposure, is formed on the second predetermined film which covers the film of the photosensitive material, and the second exposure is executed by using the second predetermined film after removing the first predetermined film.

16. The exposure method according to claim 15, wherein the first predetermined film is removed by using the second liquid.

17. The exposure method according to claim 9, wherein the operation for forming the predetermined film, which is performed between the first exposure and the second exposure, includes an operation for forming the second predetermined film on the first predetermined film having been used in the first exposure.

18. The exposure method according to claim 9, wherein:
the first exposure is executed without using the predetermined film; and
the operation for forming the predetermined film, which is performed between the first exposure and the second exposure, includes an operation for forming the second predetermined film on the film of the photosensitive material.

19. The exposure method according to claim 1, wherein the substrate, for which the first exposure has been performed, is not developed between the first exposure and the second exposure.

20. The exposure method according to claim 1, wherein the first exposure is performed in a first station, and the second exposure is performed in a second station which is different from the first station.

21. The exposure method according to claim 20, wherein both of the first station and the second station exist in a same chamber.

22. The exposure method according to claim 21, wherein both of the first exposure and the second exposure are performed on a same substrate stage which is movable while holding the substrate.

23. The exposure method according to claim 1, wherein the predetermined area on the substrate is subjected to multiple exposure including the first exposure and the second exposure.

24. An exposure method for exposing a predetermined area of a substrate, the exposure method comprising:
selecting a first liquid which is to be supplied onto the substrate in first exposure and a first film which is to be formed on the substrate and which makes contact with the first liquid in the first exposure;
selecting a second liquid which is to be supplied onto the substrate in second exposure and which is different from the first liquid and a second film which is to be formed on the substrate, which is different from the first film, and which makes contact with the second liquid in the second exposure;

forming a liquid immersion area of the first liquid on the substrate to execute the first exposure for the predetermined area; and
forming a liquid immersion area of the second liquid on the substrate, for which the first exposure has been executed, to execute the second exposure for the predetermined area.

25. The exposure method according to claim 24, further comprising forming the second film before the first exposure.

26. The exposure method according to claim 24, further comprising forming the second film after the first exposure.

27. The exposure method according to claim 24, wherein the first film is removed by the second liquid when the second exposure is performed, and the second film makes contact with the second liquid.

28. The exposure method according to claim 24, wherein the first exposure is performed in a first station, and the second exposure is performed in a second station which is different from the first station.

29. The exposure method according to claim 24, wherein both of the first exposure and the second exposure are performed on a same substrate stage which is movable while holding the substrate.

30. A method for producing a device, comprising:
exposing a substrate by the exposure method as defined in claim 1;
developing the exposed substrate; and
processing the developed substrate.

31. The method for producing the device according to claim 30, wherein the substrate is subjected to multiple exposure including the first exposure and the second exposure.

32. A substrate processing method for forming a film on a base material of a substrate on which first exposure and second exposure are to be performed, the substrate processing method comprising:
forming on the base material a first film, which is to make contact with a first liquid, before performing the first exposure through the first liquid; and
forming on the base material a second film, which is to make contact with a second liquid, before performing the second exposure through the second liquid, the second liquid being different from the first liquid and the second film being different from the first film.

33. The substrate processing method according to claim 32, wherein the base material includes a semiconductor wafer.

34. The substrate processing method according to claim 32, wherein the first and second films are determined depending on the first and second liquids respectively.

35. The substrate processing method according to claim 32, wherein each of the first and second films is one of a film of a photosensitive material and a predetermined film which covers the film of the photosensitive material.

36. The substrate processing method according to claim 32, wherein the substrate is developed after the second exposure without developing the substrate after the first exposure.

37. The substrate processing method according to claim 32, wherein the second film is soluble in a developing solution.

38. The substrate processing method according to claim 32, wherein the first film disposed on the base material is removed between the first exposure and the second exposure and/or the second film disposed on the base material is removed after the second exposure.

39. The substrate processing method according to claim 38, wherein the first film is a predetermined film which covers a film of a photosensitive material on the base material, and the predetermined film is removed between the first exposure and the second exposure.

40. The substrate processing method according to claim 39, wherein the second film is formed on the film of the photosensitive material after removing the first film.

41. The substrate processing method according to claim 39, wherein the first film is formed on the second film.

42. The substrate processing method according to claim 41, wherein the second film is formed on the film of the photosensitive material.

43. The substrate processing method according to claim 39, wherein the second film is the film of the photosensitive material.

44. The substrate processing method according to claim 32, wherein the second film is formed on the first film between the first exposure and the second exposure.

45. The substrate processing method according to claim 44, wherein the first film is a film of a photosensitive material formed on the base material.

46. The substrate processing method according to claim 32, wherein the first film is a predetermined film which covers a film of a photosensitive material on the base material, and the predetermined film is removed by using the second liquid.

47. The substrate processing method according to claim 32, wherein the substrate is subjected to multiple exposure which includes the first exposure and the second exposure.

* * * * *